(12) United States Patent
Matsumoto

(10) Patent No.: US 7,023,748 B2
(45) Date of Patent: Apr. 4, 2006

(54) SEMICONDUCTOR STORAGE DEVICE

(75) Inventor: Ken Matsumoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 186 days.

(21) Appl. No.: 10/810,627

(22) Filed: Mar. 29, 2004

(65) Prior Publication Data
US 2004/0196706 A1 Oct. 7, 2004

(30) Foreign Application Priority Data
Apr. 1, 2003 (JP) ............................. 2003-098479

(51) Int. Cl.
*G11C 7/00* (2006.01)

(52) U.S. Cl. ...................................... 365/200; 365/201
(58) Field of Classification Search ................ 365/200, 365/201, 195, 230.09
See application file for complete search history.

(56) References Cited

U.S. PATENT DOCUMENTS

| 5,140,556 A | * | 8/1992 | Cho et al. ................... 365/207 |
| 5,745,420 A | * | 4/1998 | McClure ..................... 365/201 |
| 6,314,011 B1 | * | 11/2001 | Keeth et al. ................. 365/51 |

* cited by examiner

*Primary Examiner*—Vu A. Le
(74) *Attorney, Agent, or Firm*—Oblon, Spivak, McClelland, Maier & Neustadt, P.C.

(57) ABSTRACT

A semiconductor storage device which can be evaluated correctly. A shift processing circuit 5 sequentially shifts row addresses in a line direction to reassign them in a memory cell array MSA10. A data inversion determination unit 8 identifies bit line pairs BL1, . . . , BL128 of which the wire position switching parts CCAR10 and CCAR11 cross a word line specified by an input row address, according to the twisting positions and shift, to determines whether to invert the level of evaluation test data D8 which is input/output to/from the bit line pairs BL1, . . . , BL128. The inversion processor 4 inverts the level of the evaluation test data D8 which is input to and output from the bit line pairs BL1, . . . , BL128, to correctly store the evaluation test data D8 of level "0", "1" in memory cells in a storing pattern and output the data by offsetting the inversion applied at the time of storage. As a result, the semiconductor storage device can be evaluated correctly.

3 Claims, 16 Drawing Sheets

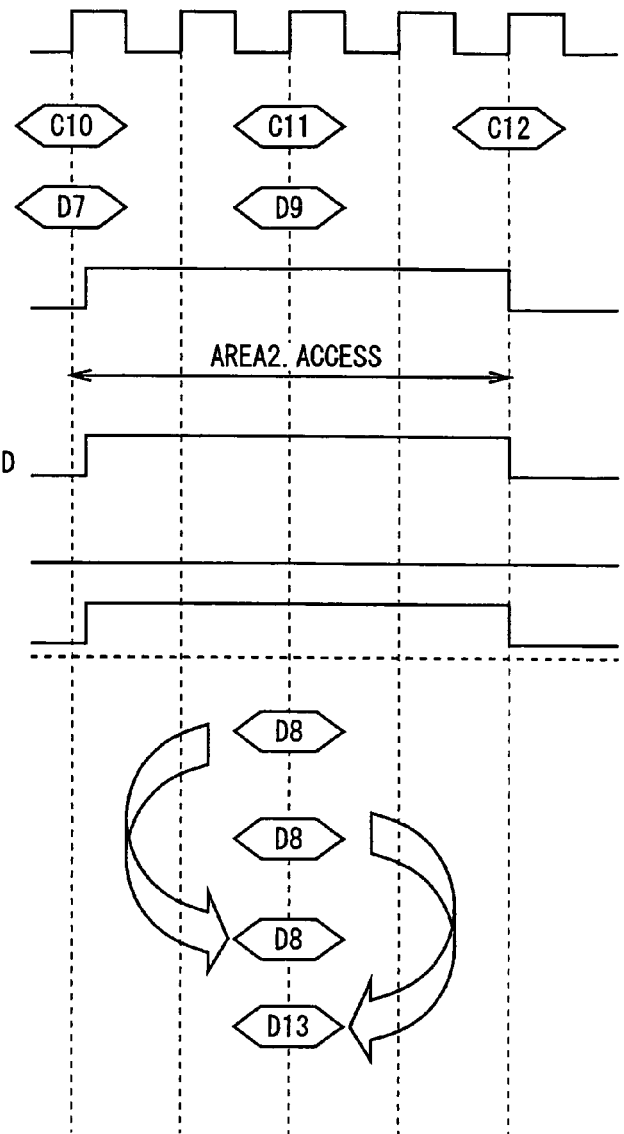

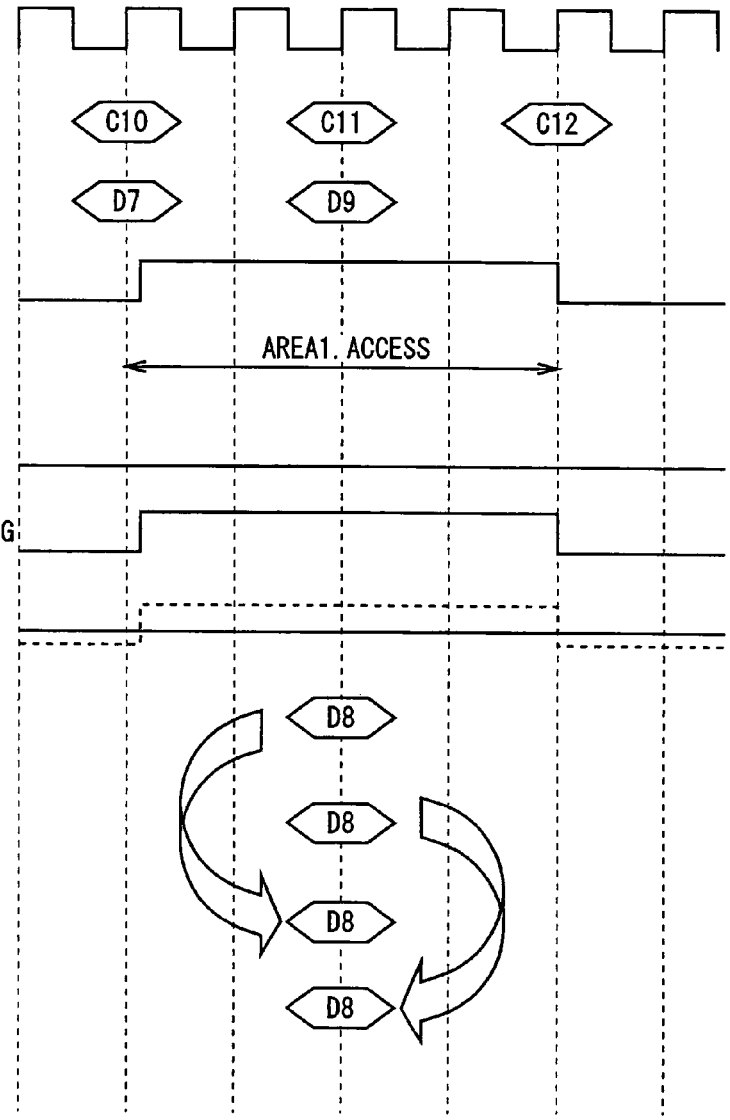

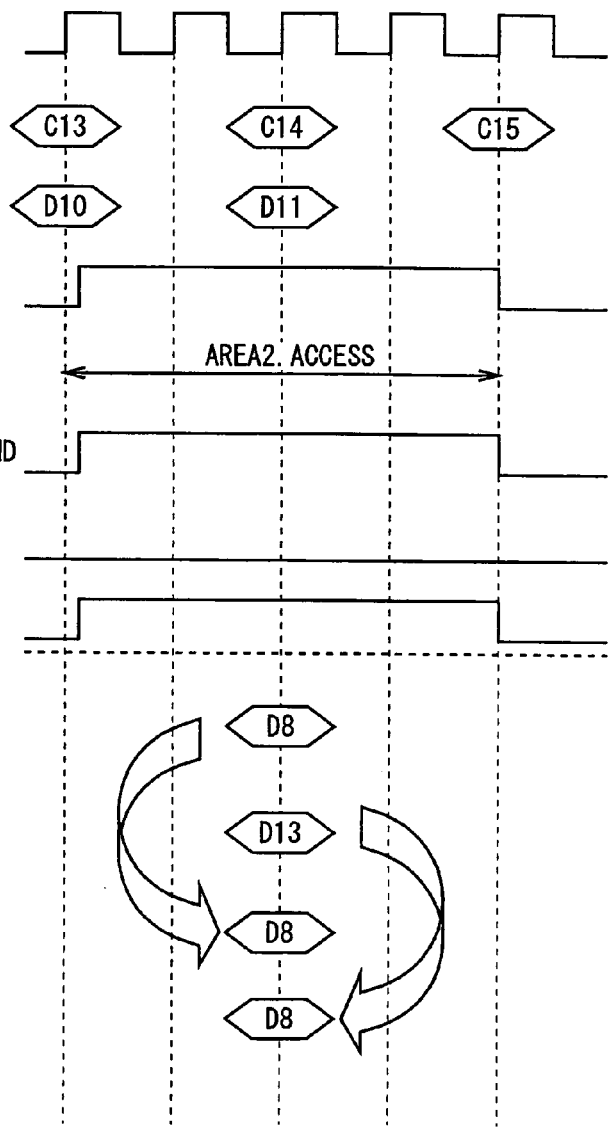
FIG. 14A CLOCK
FIG. 14B COMMAND
FIG. 14C ADDRESS DATA
FIG. 14D ROW ADDRESS
FIG. 14E AREA
FIG. 14F INVERTING COMMAND
FIG. 14G NON-INVERTING COMMAND
FIG. 14H INVERSION CONTROLL
FIG. 14I DATA FOR SINGLE TWIST
FIG. 14J DATA FOR DOUBLE TWIST
FIG. 14K DATA
FIG. 14L DATA FIG. 15A CLOCK
FIG. 15B COMMAND 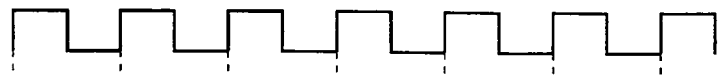
FIG. 15C ADDRESS DATA 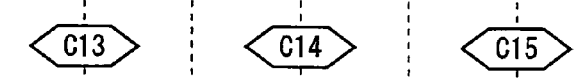
FIG. 15D ROW ADDRESS 
FIG. 15E AREA 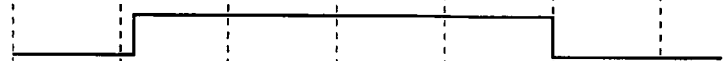
FIG. 15F INVERTING COMMAND 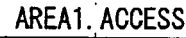
FIG. 15G NON-INVERTING COMMAND 
FIG. 15H INVERSION CONTROLL 
FIG. 15I DATA FOR SINGLE TWIST 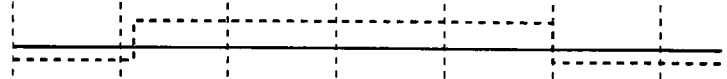
FIG. 15J DATA FOR DOUBLE TWIST 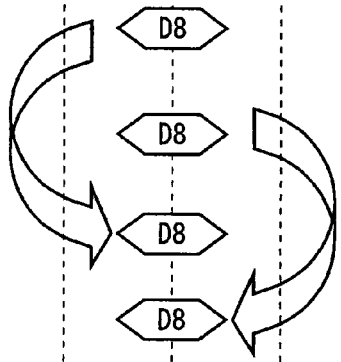
FIG. 15K DATA 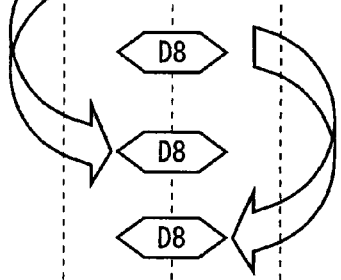
FIG. 15L DATA 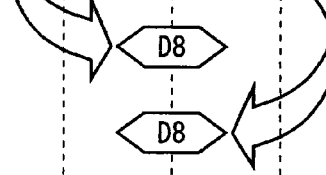

SEMICONDUCTOR STORAGE DEVICE

BACKGROUND OF THE INVENTION

1. Field of the Invention

This invention relates to a semiconductor storage device, and is suitably applied to a semiconductor storage device composed of, for example, a dynamic random access memory (DRAM).

2. Description of the Related Art

In conventional semiconductor storage devices, memory cell arrays are provided in such a manner that a plurality of memory cells which are the minimum units of data storage element is arranged in a array structure, a plurality of word lines parallel to a row direction of the memory cells arranged in the array structure and a plurality of bit lines parallel to a line direction are arranged in a lattice pattern, and each memory cell is connected to a word line and a bit line at the crossing position of the word line and bit line.

Further, in such semiconductor storage devices, redundant columns are also provided in such a manner that a plurality of redundant memory cells which is usable instead of broken memory cells is arranged in an array structure on one side in a line direction of a memory cell array, word lines parallel to the row direction (hereinafter, referred to as redundant word lines) and bit lines parallel to the line direction are arranged, and each redundant memory cell is connected to a redundant word line and a bit line at the crossing position of the redundant word line and bit line.

In the semiconductor devices, if a memory cell is broken in a memory cell array, a plurality of redundant memory cells of one row in the array structure is used instead of a plurality of memory cells of one row including the broken memory cell in an array structure. As a result, data can be stored and reproduced by using the same number of memory cells as a plurality of memory cells in the memory cell array if a broken memory cell exists (for example, refer to page 3 in Japanese Patent Laid Open No. 11-120788).

In another kind of semiconductor storage devices which is provided with memory cell arrays in such a manner that a plurality of word lines being connected to a plurality of memory cells and a plurality of redundant word lines being connected to a plurality of redundant memory cells are wired next to each other in a line direction, use of redundant memory cells, so-called a shift-redundancy method is applied. In this method, row addresses from a row address assigned to a word line being connected to a broken memory cell to a row address assigned to a word line next to a redundant word line are reassigned to other word lines and redundant word lines by sequentially shifting them in a line direction in a unit of even number of row addresses. Thereby a plurality of redundant memory cells being connected to the redundant word lines is made usable, instead of a plurality of memory cells including the broken cell being connected to the word line.

In addition, recently, with the progresses of semiconductor fine processing techniques, a floating capacity reducing method called a twisted-bit line architecture has been proposed for semiconductor storage devices employing the shift-redundancy method. As shown in FIG. 1, two bit lines BL1A and BL1B, BL2A and BL2B, . . . , BLNA and BLNB in order in a row direction shown in an arrow R are designated to operate in a pair as bit line pairs BL1, BL2, . . . , BLN in a memory cell array MSA1, and the two bit lines BL1A and BL1B, BL3A and BL3B of the bit line pairs BL1, BL3, . . . are switched once or plural times in a line direction, so as to reduce floating capacity between the twisted bit line pairs BL1, BL3, . . . and their neighboring bit line pairs BL2, . . . , BLN, resulting in avoiding interference noise which is caused by capacity connection between the bit line pairs BL1, BL2, BL3, . . . , BLN.

In this connection, in the semiconductor storage devices having the above structure, two memory cells MS out of a plurality of memory cells MS of one line are arranged in each region (hereinafter, referred to as a memory cell region) surrounded by a bit line pair BL1, . . . , BLN and two word lines WL1 and WL2, . . . , WLN-1 and WLN, WLT1 and WLT2, . . . .

In each memory cell region having the bit line pairs BL1, . . . , BL1N of which the wire positions of the two bit lines BL1A and BL1B, . . . , BLNA and BLNB are not switched, (hereinafter, these parts are referred to as wire position nonswitching parts NCAR1 to NCAR4), that is, in each memory cell from the input/output stages of the bit line pairs BL1, . . . , BL1N till the twisting positions, one memory cell MS is connected to one bit line BL1, . . . , BLNA and one word line WL1, . . . , WLN-1, WLT1 and the other memory cell MS is connected to the other bit line BL1B, . . . , BLNB and the other word line WL2, . . . , WLN, WLT2, . . . .

In addition, in each memory cell having the bit line pairs BL1, . . . , BL1N of which the wire positions of the two bit lines BL1A and BL1B, BL3A and BL3B, . . . are switched by twist (hereinafter, these parts are referred to as wire position switching parts CCAR1 and CCAR2), one memory cell MS is connected to the other bit line BL1B, BL3B, . . . and one word line WL1, . . . , WLN-1, WLT1, . . . , and the other memory cell MS is connected to one bit line BL1A, BL3A, . . . , and the other word line WL2, . . . , WLN, WLT2, . . . .

For the semiconductor storage devices employing the shift-redundancy method and the twisted-bit line architecture, an evaluation test of data dependency called pattern sensitive in each memory cell MS has been also proposed. This test is conducted in manufacturing in such a manner that, as shown in FIG. 2, evaluation test data of level "0", "1" is stored in the memory cells MS of the memory cell array MSA1 in a prescribed storing pattern selected depending on the physical arrangement of the memory cells MS, for example, checkerwise, and are reproduced, and then the level of the evaluation test data before storage are compared with the level of the evaluation test data reproduced.

In such semiconductor storage devices, however, evaluation test data cannot be stored in the memory cells MS in a previously selected storing pattern easily. This is because, as shown in FIG. 3, when evaluation test data of level "0", "1" for evaluation test of data dependency, which are entered from the outside, are given to, for example, one-sided bit lines BL1A, . . . , BLNA of the bit line pairs BL1, . . . , BLN, the evaluation test data are stored in one-sided memory cells MS out of the one- and the other-sided memory cells MS in the wire position nonswitching parts NCAR1 to NCAR4 of the bit line pairs BL1, BL3, . . . . In the wire position switching parts CCAR1 and CCAR2, however, the evaluation test data are stored in the other-sided memory cells MS with, for example, inverting the level of the data in the wire position switching parts CCAR1 and CCAR2.

Therefore, for such semiconductor storage devices, such method is considered that row addresses assigned to the word lines crossing the wire position switching parts CCAR1 and CCAR2 of the bit line pairs BL1, . . . , BLN are stored in advance, and the evaluation test data are given to the bit line pairs BL1, . . . , BLN after inverting the level of the evaluation test data when a row address is specified for storing the evaluation test data from the outside.

The semiconductor storage devices employing this method have also a problem in that the evaluation test data cannot be stored in the memory cells MS in a storing pattern easily. This is because, as shown in FIG. 4, when row addresses assigned to word lines WLN-1, WLN, WLT1, WLT2, . . . are shifted over twisting positions in a line direction shown by an arrow K in a unit of even number of row addresses by performing shift-redundancy process due to the detection of a broken memory cell BMS, the word lines WLN-1, WLN, WLT1, WLT2, . . . crossing the wire position switching parts CCAR1 and CCAR2 cannot be specified based on the pre-stored row addresses correctly.

SUMMARY OF THE INVENTION

In view of the foregoing, an object of this invention is to provide a semiconductor storage device that can be evaluated correctly.

The foregoing objects and other objects of the invention have been achieved by the provision of a semiconductor storage device. In the semiconductor storage device is provided with a memory cell array in such a manner that a plurality of memory cells is arranged in an array structure, a plurality of redundant memory cells is arranged in an array structure at prescribed positions in a row direction and/or line direction of the plurality of memory cells in the array structure, a plurality of bit line pairs each composed of two bit lines arranged in almost parallel to the line direction and having wire position switching parts created by twisting the two bit lines at one or plural positions in the line direction is arranged, a plurality of word lines is arranged in almost parallel to the row direction, and each memory cell or redundant memory cell is connected to a bit line and a word line at a crossing position of the bit line and the word line. In this memory cell array, a shift redundancy unit reassigns line addresses assigned to a plurality of bit line pairs being connected to a plurality of memory cells, to a plurality of other bit line pairs by sequentially shifting the line addresses in the row direction in a unit of a prescribed line address manageable number, in order to make redundant memory cells of prescribed lines usable for data storage and reproduction instead of a plurality of memory cells of the prescribed lines equal to the line address manageable number, and/or reassigns row addresses assigned to a plurality of word lines being connected to a plurality of memory cells, to a plurality of other word lines by sequentially shifting the row addresses in the line direction in a unit of a prescribed row address manageable number, in order to make a plurality of redundant memory cells of prescribed rows usable for the data storage and reproduction instead of a plurality of memory cells of the prescribed rows equal to the row address manageable number. At the time of storing and reproducing evaluation test data in this situation, an identification unit identifies the bit line pairs of which the wire position switching parts crosses a word line specified by an input row address, based on the twisting positions of the bit line pairs and the shift of the row addresses. A determination unit determines based on the identification result of the identification unit whether to invert the level of the evaluation test data to be given to the bit line pairs of which the wire position switching parts cross the word line and to be output from the bit line pairs. Then an inversion unit, depending on the determination result of the determination unit, inverts the level of the evaluation test data to be supplied to the bit line pairs of which the wire position switching parts cross the word line at the time of storing the evaluation test data, and inverts the level of the evaluation test data output from the bit line pairs of which the wire position switching parts cross the word line at the time of reproducing the evaluation test data.

As a result, the evaluation test data of level "0", "1" can be correctly stored in the memory cells and redundant memory cells in the memory cell array in a storing pattern previously selected according to the physical arrangement of the memory cells, and the evaluation test data stored can be output by inverting its level so as to offset the inversion applied at the time of storage.

The nature, principle and utility of the invention will become more apparent from the following detailed description when read in conjunction with the accompanying drawings in which like parts are designated by like reference numerals or characters.

BRIEF DESCRIPTION OF THE DRAWINGS

In the accompanying drawings:

FIGS. 12A to 12L and 13A to 13L are timing charts explaining the storage of the evaluation test data;

FIGS. 14A to 14L and 15A to 15L are timing charts explaining the reproduction of the evaluation test data.

DETAILED DESCRIPTION OF THE EMBODIMENT

Figure 1:
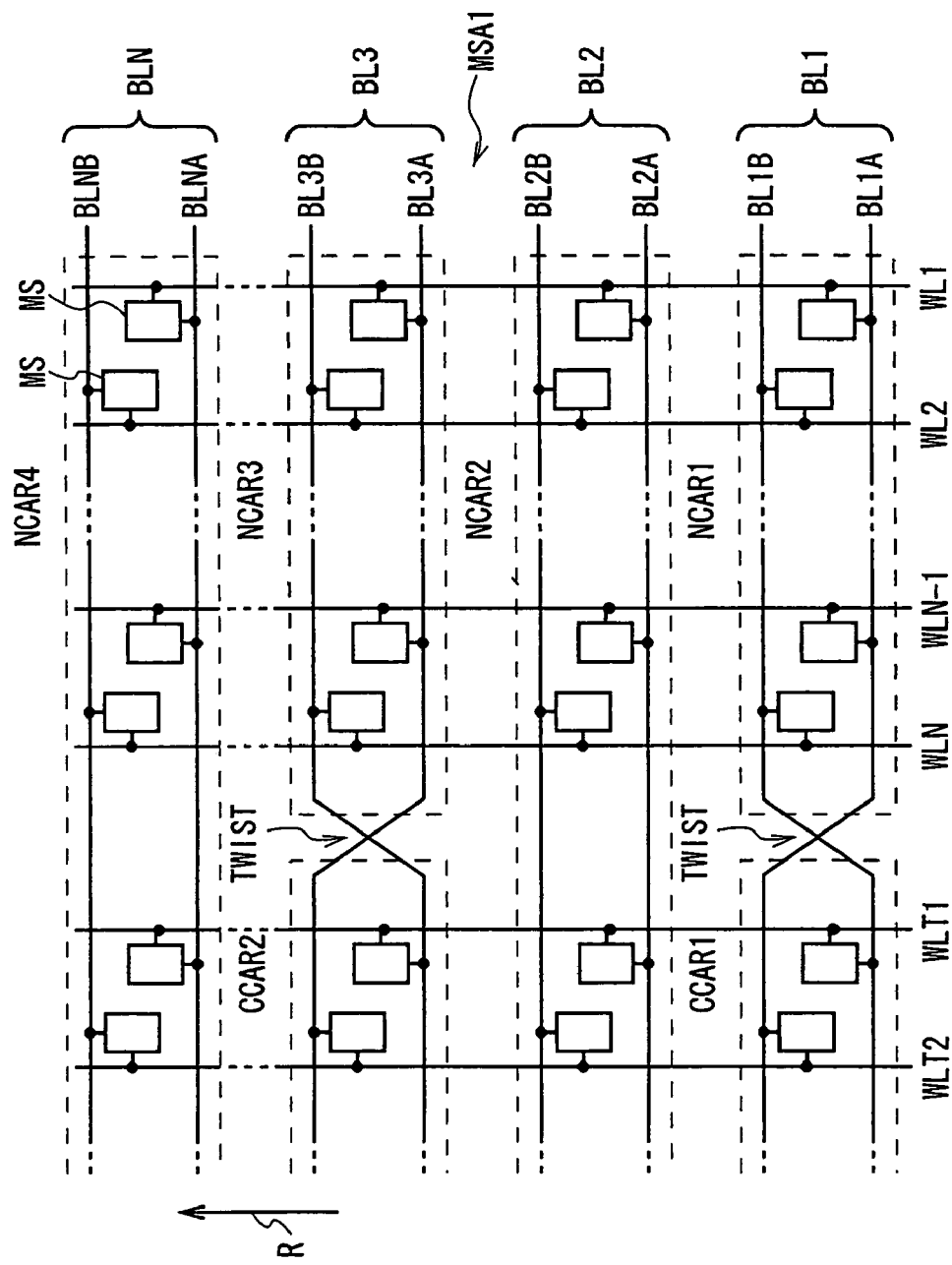
FIG. 1 is a block diagram explaining a twisted-bit line architecture.
Figure 2:
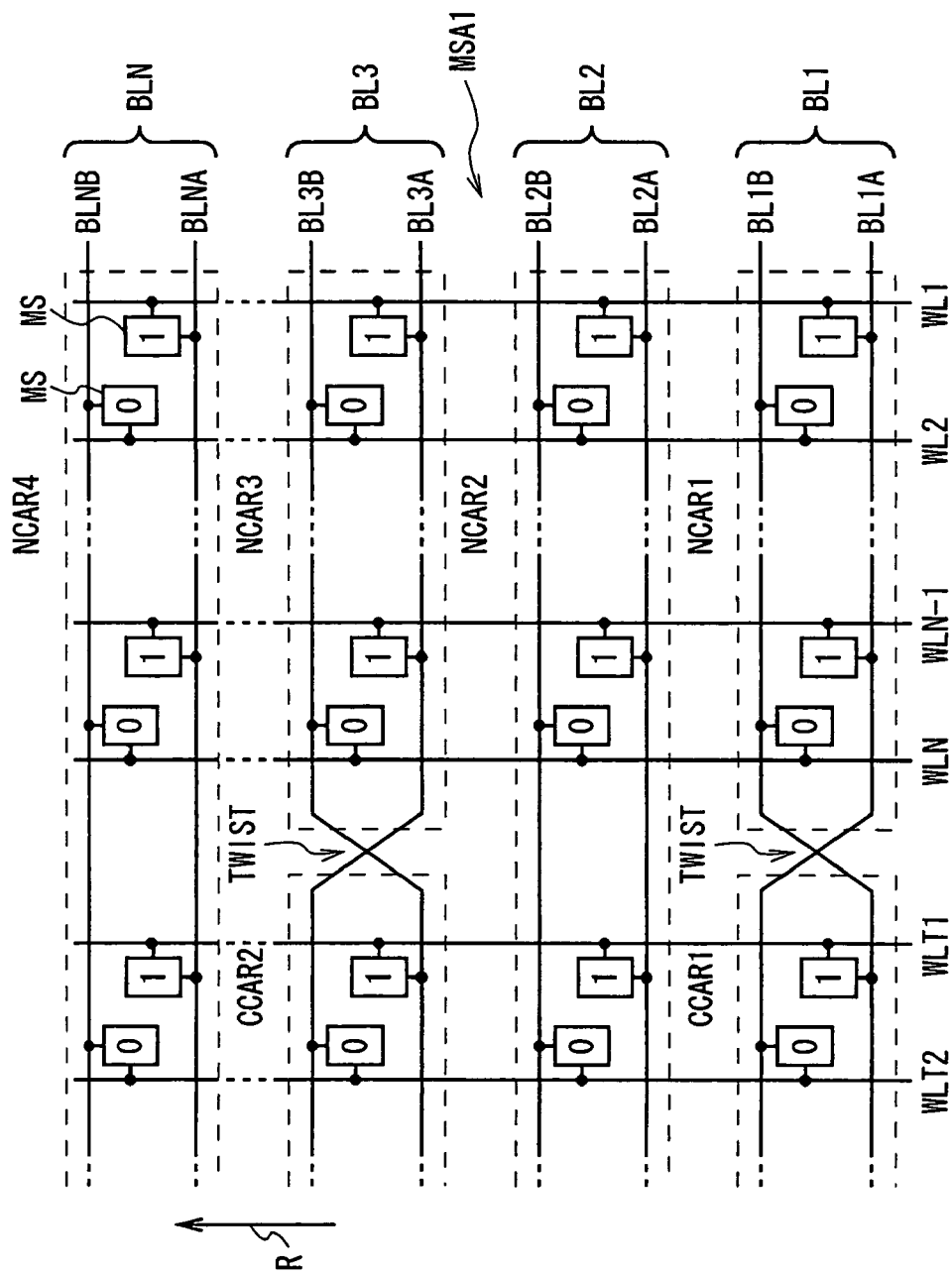
FIG. 2 is a block diagram explaining an evaluation test of data dependency.
Figure 3:
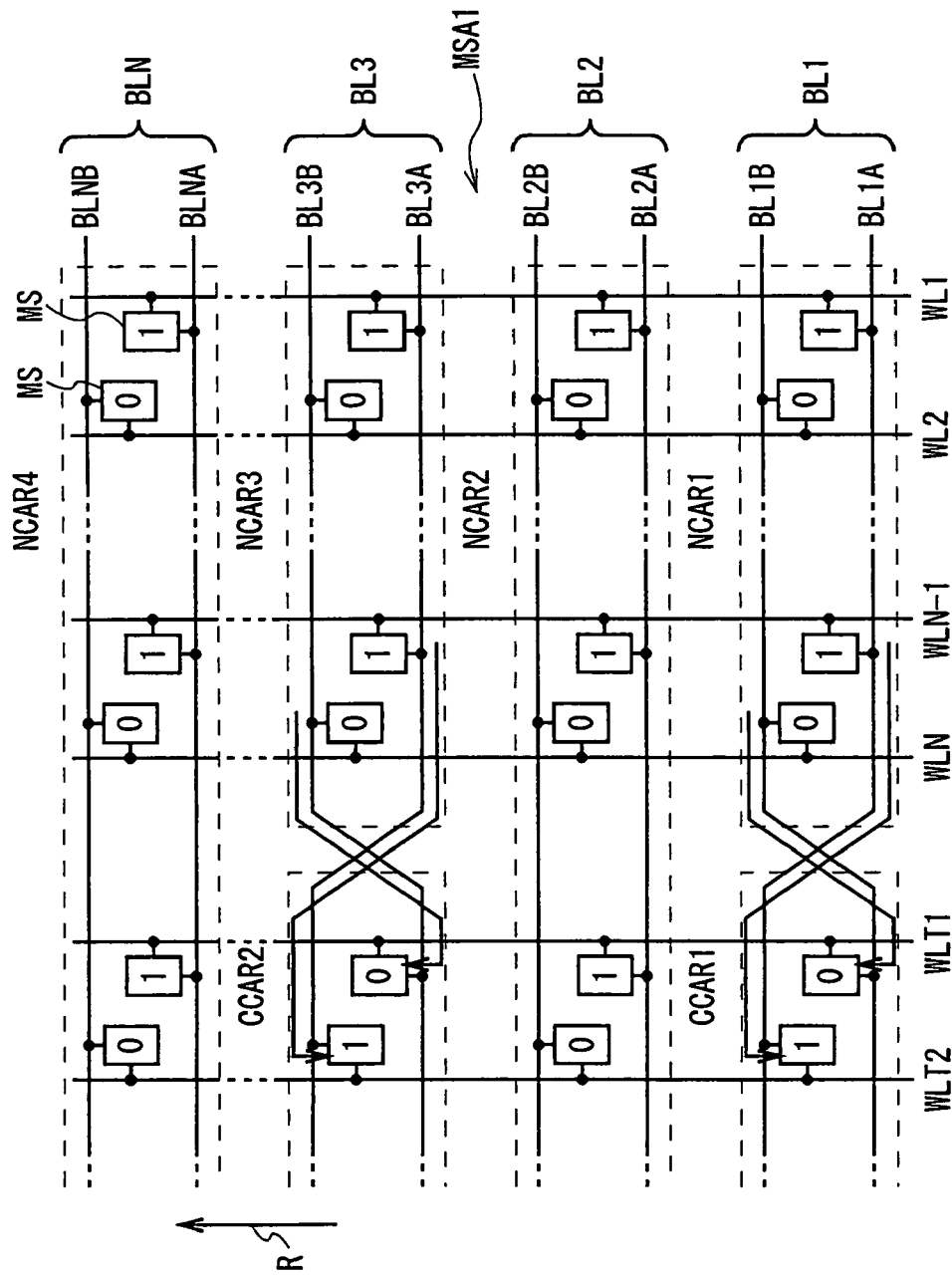
FIG. 3 is a block diagram explaining the storage of evaluation test data in memory cells connected to wire position switching parts.
Figure 4:
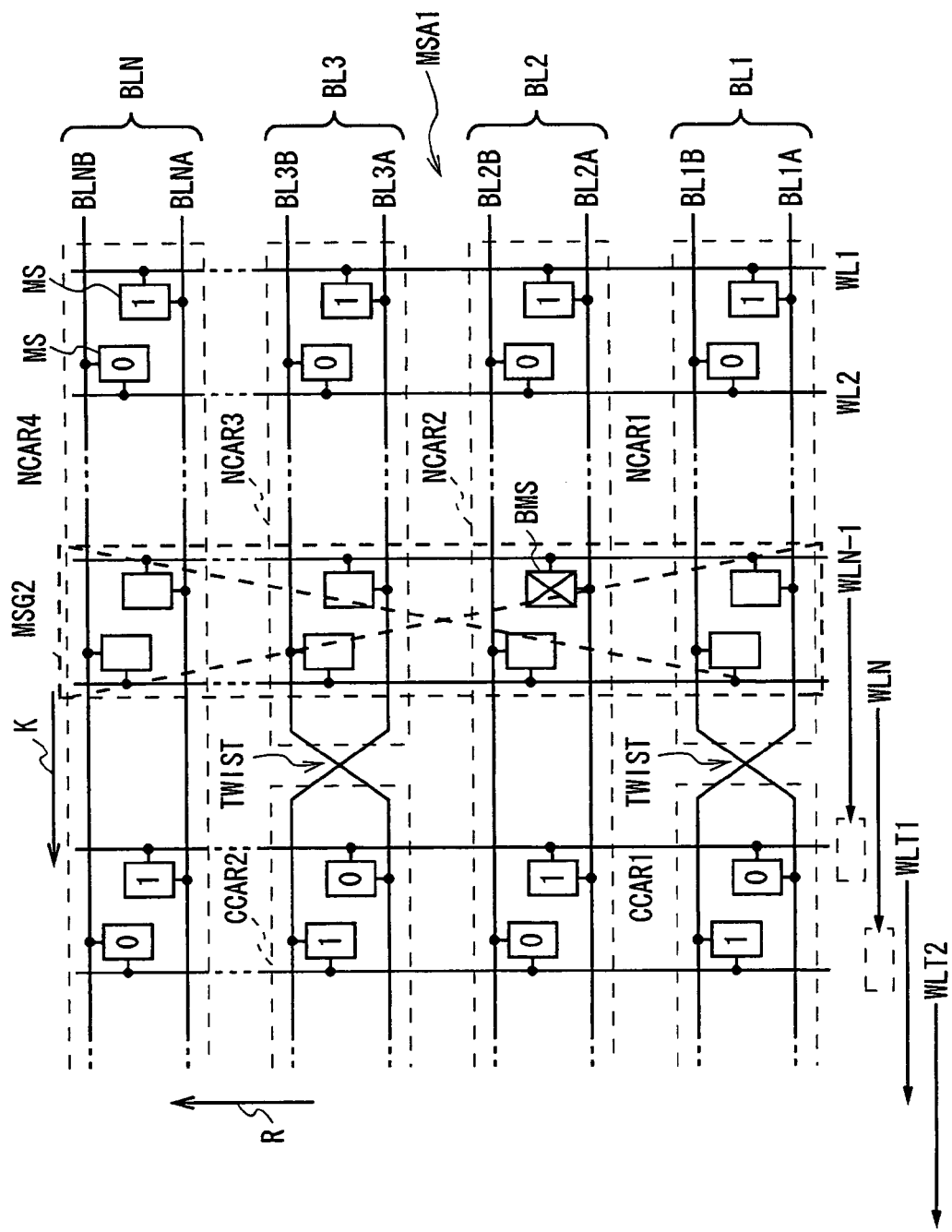
FIG. 4 is a block diagram explaining an evaluation test of data dependency at the time of shifting row addresses.
Figure 5:
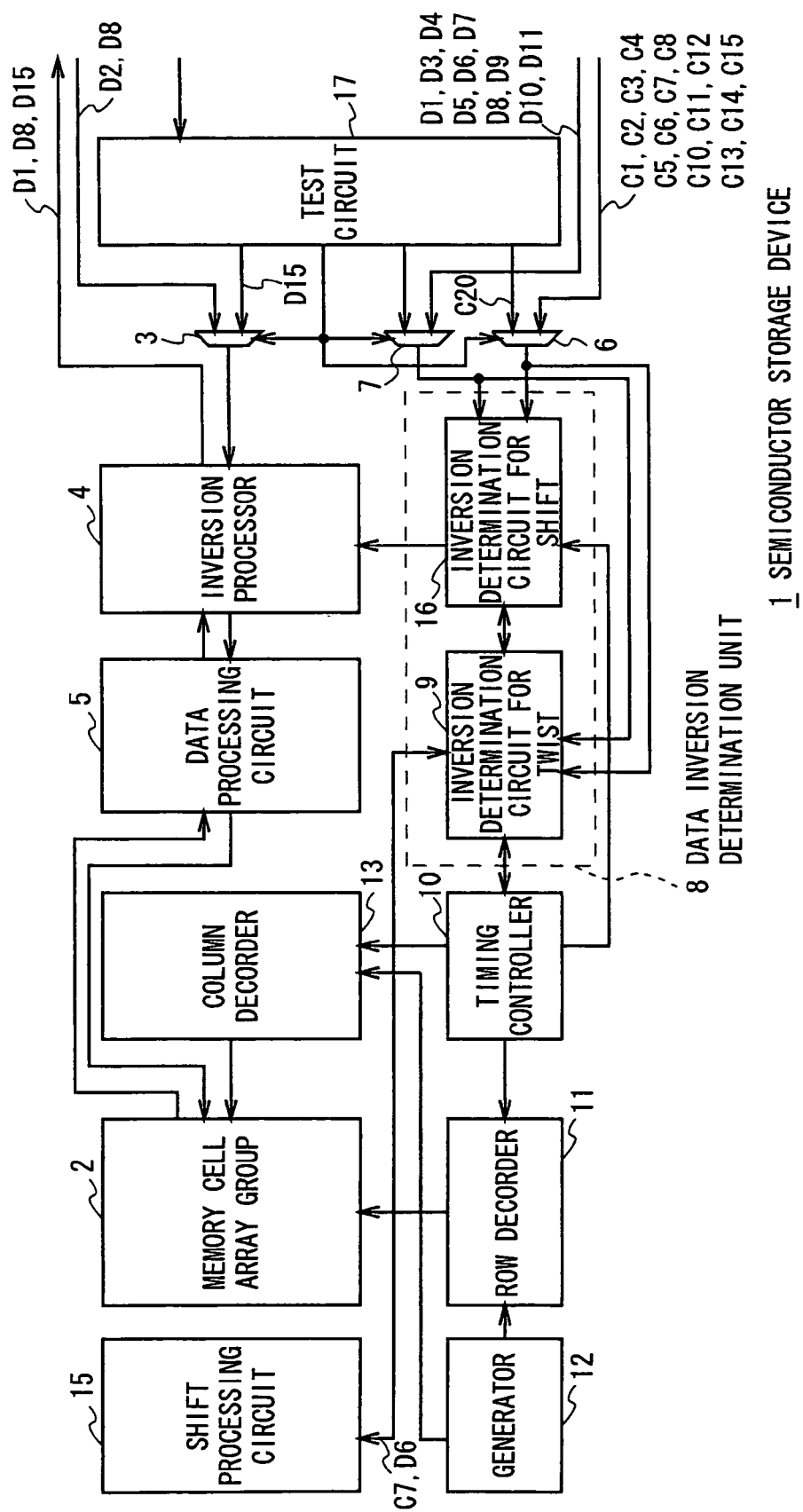
FIG. 5 is a block diagram showing one embodiment of a circuit structure of a semiconductor storage device according to the present invention.

Preferred embodiments of this invention will be described with reference to the accompanying drawings:

Referring to FIG. 5, reference numeral 1 shows a semiconductor storage device employing a shift-redundancy method and a twisted-bit line architecture, which has a memory cell array group 2 comprising a plurality (for example, four) of memory cell arrays.

Figure 6:
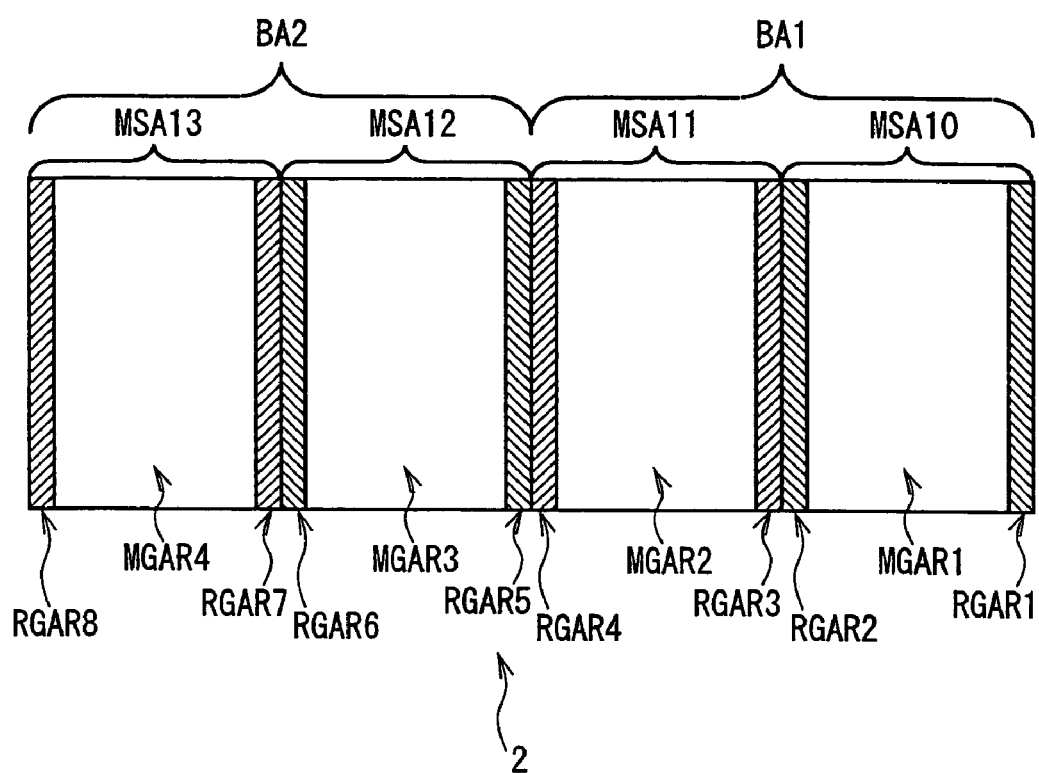
FIG. 6 is a schematic diagram showing the structure of a memory cell group.

Referring to FIG. 6, the memory cell array group 2 is composed of two banks BA1 and BA2 each comprising two memory cell arrays MSA10 to MSA13 each having a storage capacity of 1 Mbit.

Figure 7:
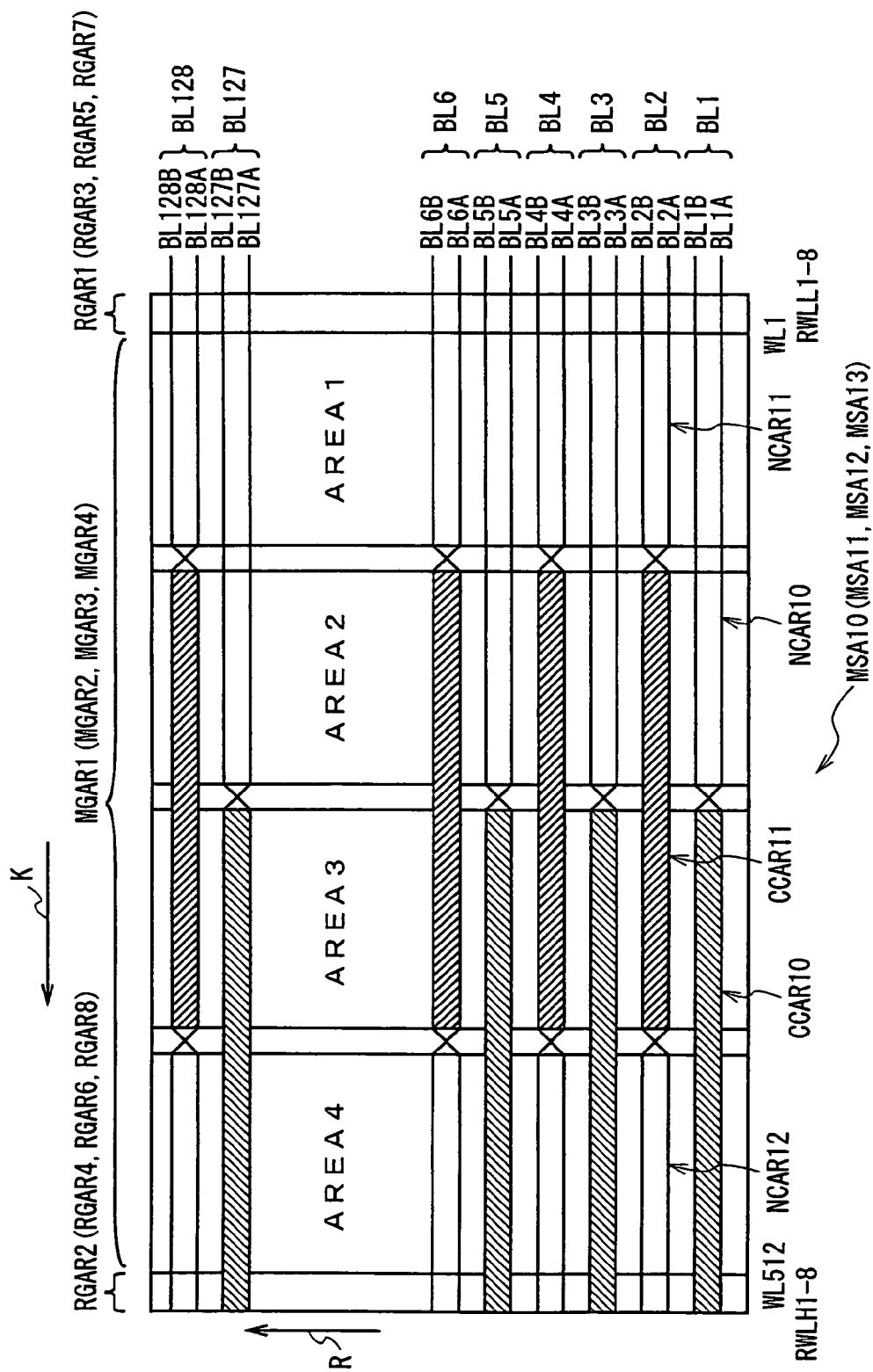
FIG. 7 is a schematic diagram showing the structure of a memory cell array.

The memory cell arrays MSA10 to MSA13 have the same structure. The structure of the memory cell array MSA10 will be described as an example. Referring to FIG. 7, arranged in a center is memory cell regions MGAR1 (MGAR2 to MGAR4) where a plurality of memory cells are arranged in an array structure composed of a plurality of rows (for example, 512 rows) parallel to a row direction shown by an arrow R and a plurality of lines (64 lines) parallel to a line direction shown by an arrow K and word lines WL1, ..., WL512 are wired in correspondence with the plurality of rows of the memory cells.

Further, arranged on both sides in the line direction of the memory cell array MSA10 are redundant memory cell regions RGAR1 (RGAR3, RGAR5, RGAR7) and RGAR2 (RGAR4, RGAR6, RGAR8). In each of these regions, a plurality of redundant memory cells are arranged in an array structure composed of plural rows (for example, 8 rows) and plural lines (for example, 64 lines), and a plurality (for example, 8) of word lines (hereinafter, referred to as redundant word lines) RWLH1, ..., RWLH8, or RWLL1, ..., RWLL8 are wired in correspondence with the rows of the redundant memory cells.

Further, in the memory cell array MSA10, plural pairs (for example, 128) of bit lines BL1A, BL1B, ..., BL128A, BL128B are wired as bit line pairs BL1, ..., BL128 in correspondence with the lines of the memory cells and redundant memory cells in an array structure, from the redundant memory cell region RGAR1 locating on one end in the line direction through the memory cell region MGAR1 to the redundant memory cell region RGAR2 locating on the other end.

In this case, the one end in the line direction of each bit line pair BL1, ..., BL128 is specified as a data input/output stage.

Out of the bit line pairs BL1, ..., BL128, each of odd-numbered bit line pairs BL1, ..., BL127 is twisted once at almost the center between the both ends in the line direction. Each of even-numbered bit line pairs BL2, ..., BL128 is twisted twice at the center between the one end and the center in the line direction and at the center between the center and the other end (that is, a relation in wire positions between a pair of bit lines BL2A and BL2B, ..., BL128A and BL128B is returned by double twists).

In addition, the memory cell array MSA10 is divided into almost four equal areas, first to fourth areas AREA1 to AREA4, between the both ends in the line direction, with one twisting position of the odd-numbered bit line pairs BL1, ..., BL127 and two twisting positions of the even-numbered bit line pairs BL2 ..., BL128 as boarders (hereinafter, referred to as area borders).

Therefore, in the bit line pairs BL1, ..., BL127 twisted once, a part wired on the first and second areas AREA1 and AREA2, from one end (including a part wired on the redundant memory cell region RGAR1) in a line direction to the area border between the one end and the other end, is a wire position nonswitching part NCAR10 in which the wire positions of the two bit lines BL1A and BL1B, ..., BL127A and BL127B are not switched with respect to the input/output stage, and a part wired on the third and fourth areas AREA3 and AREA4, from the area boarder to the other end (including a part wired on the redundant memory cell region RGAR2) in the line direction, is a wire position switching part CCAR10 in which the wire positions of the two bit lines BL1A and BL1B, ..., BL127A and BL127B are switched with respect to the input/output stage.

In the bit line pairs BL2, ..., BL128 twisted twice, parts wired on the first area AREA1 from one end (including a part wired on the redundant memory cell region RGAR1) to an area boarder on the one end side and the fourth area AREA4 from an area boarder on the other end side in the line direction to the other end (including a part wired on the redundant memory cell region RGAR2) in the line direction are wire position nonswitching parts NCAR11 and NCAR12 of the pairs of bit lines BL2A and BL2B, ..., BL128A and BL128B, and a part wired on the second and third areas AREA2 and AREA3 from the area boarder on the one end side to the area boarder on the other end side is a wire position switching part CCAR11 of the pair of bit lines BL2A and BL2B, ..., BL128A and BL128B.

Figure 8:
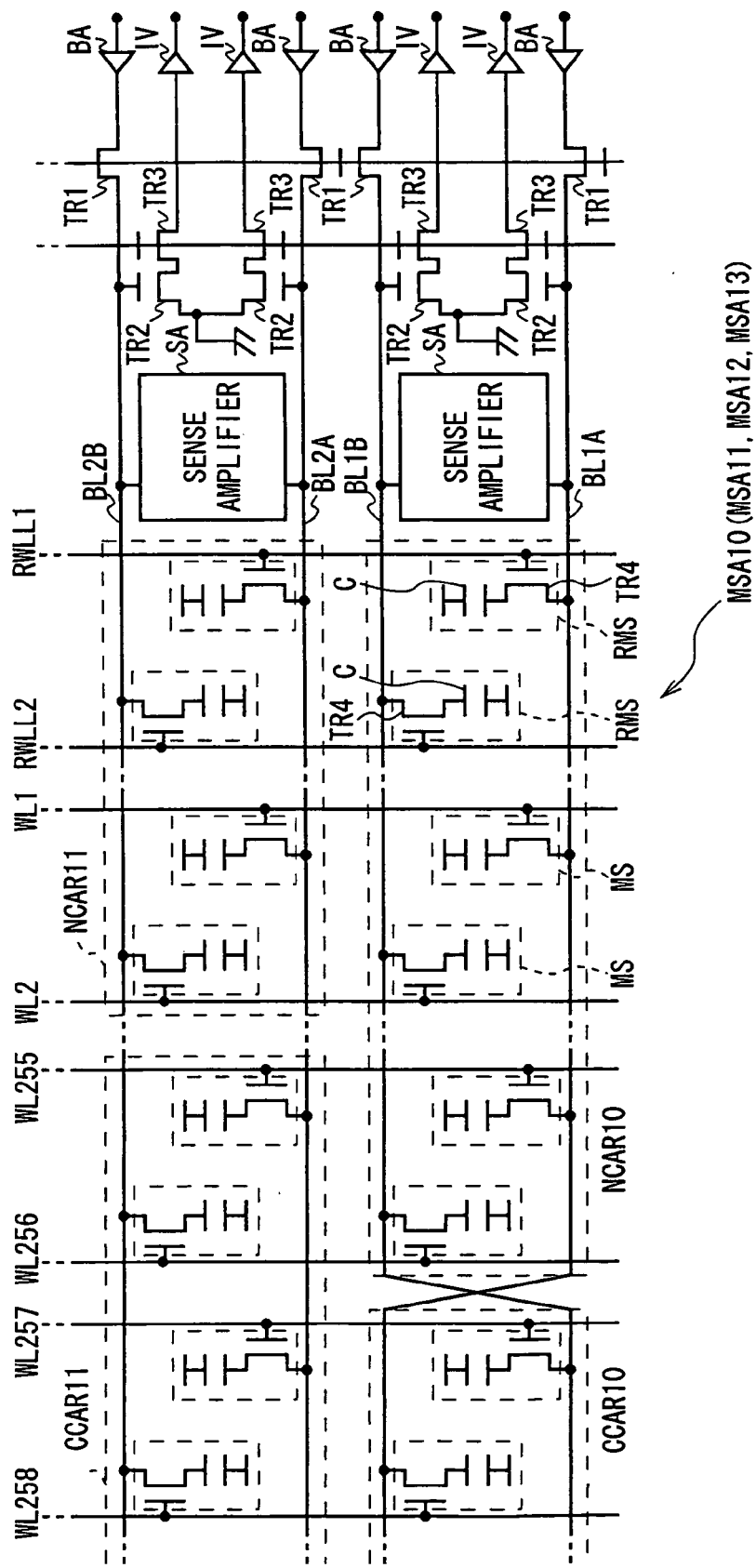
FIG. 8 is a block diagram showing the detailed structure of the memory cell array.

The structure of this memory cell array MSA10 will be described in more detail. As shown in FIG. 8, at the input/output stages of the bit line pairs BL1, ..., BL1128, one-sided ends of the pairs of the bit lines BL1A and BL1B, ..., BL128A and BL128B are connected to the sources of storing control transistors TR1, the input terminals are connected to the drains of the storing control transistors TR1 via buffers BA.

In addition, the pairs of the bit lines BL1A and BL1B, ..., BL128A and BL128B are connected to the gates of the first reproduction control transistors TR2, and the sources of the first reproduction control transistors TR2 are grounded in common in the pairs of the bit lines BL1A and BL1B, ..., BL128A and BL128B.

Connected to the drains of the first reproduction control transistors RT2 are the sources of the second reproduction control transistors TR3. Connected to the drains of the second reproduction control transistors TR3 are the output terminals via inverting circuits IV with a buffer function.

In addition, sense amplifiers SA are arranged between the pairs of the bit lines BL1A and BL1B, ..., BL128A and BL128B of the bit line pairs BL1, ..., BL128 in parallel.

In each memory cell MS, one end of a capacitor C is connected to the source of a metal oxide semiconductor (MOS) transistor TR4 while the other end of the capacitor C is connected to a power source applying prescribed voltage.

In a memory cell region for each memory cell MS, which is surrounded by a bit line pair BL1, ..., BL128 and two word lines WL1, ..., WL512, the gate of the MOS transistor RT4 is connected to one word line WL1, ..., WL512 while the drain of the MOS transistor RT4 is connected to one bit word line BL1A, BL1B, ..., BL128A, BL128B.

The word lines WL1, ..., WL512 are previously assigned continuous row addresses expressed in a binary number in a wire arrangement order. The bit line pairs BL1, ..., BL128 are assigned continuous line addresses expressed in a binary number in a wire arrangement order. Therefore, by specifying a row address and a line address, a single memory cell MS is specified, which is connected to a single word line WL1, ..., WL512 specified by the row address and a single bit line pair BL1, ..., BL128 specified by the line address (actually, which is connected to a single word line WL1, ..., WL512 and a single bit line BL1A, ..., BL128B).

The connection relations among the pairs of bit lines BL1A and BL1B, ..., BL128A and BL128B of the bit line pairs BL1, ..., BL128, the word lines WLI, ..., WL512, and the memory cells MS are similar to the case described with reference to FIG. 5 for the wire position nonswitching parts NCAR10 to NCAR12 and the wire position switching parts CCAR10 and CCAR11.

The connection relations among the pairs of bit lines BL1A and BL1B, ..., BL128A and BL128B of the bit line pairs BL1, ..., BL128, the redundant word lines RWLL1, ..., RWLL8 and RWLH1, ..., RWLH8, and the redundant memory cells RMS are also similar to the case described with reference to FIG. 5 for the wire position nonswitching parts NCAR10 to NCAR12 and the wire position switching part CCAR10.

For normal data storage, the semiconductor storage device 1 (FIG. 5) receives an active command C1 for storing start and row address data D1 specifying one row address assigned to a single word line WL1, ..., WL512 from the outside. Then the semiconductor storage device 1 takes the active command C1 and the row address data D1 in an inversion determination circuit for twist 9 of a data inversion determination unit 8 via selection circuits 6 and 7.

The inversion determination circuit for twist 9 sends the active command C1 and the row address data D1 to a row decoder 11 via a timing controller 10.

Figure 9:
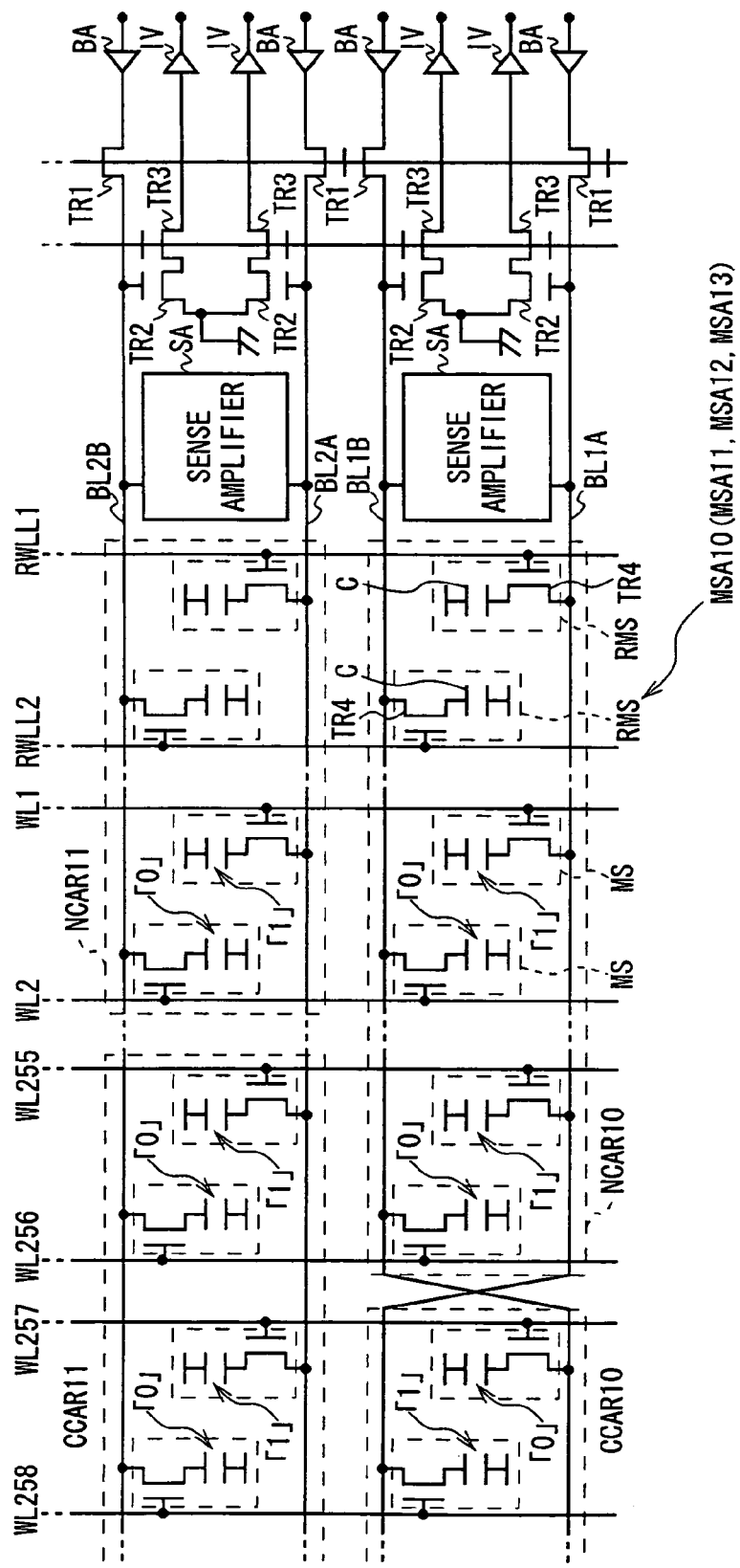
FIG. 9 is a block diagram explaining how to store/reproduce data to/from memory cells.

Referring to FIG. 9, the row decoder 11 starts a process of setting a word line WL1, ..., WL512 for data storage in accordance with the active command C1. In the memory cell arrays MSA10 to MSA13 of the memory cell array group 2, prescribed voltage generated by a generator 12 is applied to a single word line WL1, ..., WL512 specified by one row address based on the row address data D1, so as to set ON the MOS transistors TR4 of the memory cells MS being connected to the word line WL1, ..., WL512.

In this condition, the semiconductor storage device 1 takes one or a plurality of data D2 of level "0", "1" to be stored, sequentially received from the outside, in an inversion processor 4 via a selection circuit 3. Then the data processing circuit 5 applies a prescribed process for storage on the data D2 and sends the resultant to the memory cell array group 2.

In addition, the inversion determination circuit for twist 9 takes in a storing command C2 and line address data D3 specifying one or plural line addresses assigned one or plural bit line pairs BL1, ..., BL128, entered from the outside, via the selection circuits 6 and 7.

The inversion determination circuit for twist 9 sends the storing command C2 and the line address data D3 to a column decoder 13 via the timing controller 10.

The column decoder 13, as shown in FIG. 9, starts a data storing process in accordance with the storing command C2. In the memory cell arrays MSA10 to MSA13 of the memory cell array group 2, prescribed voltage generated by the generator 12 is applied to the gates of the storing control transistors TR1 corresponding to one or plural bit line pairs BL1, ..., BL128 specified by one or plural line addresses based on the line address data D3, so as to set the transistor TR1 ON.

Therefore, in the memory cell arrays MSA10 to MSA13, the row decoder 11 and the column decoder 13 take the data D2 to be stored, which is received via the buffers BA from the input terminals, in the one or plural bit lines BL1A, ..., BL128B specified by one or plural line addresses, via the storing control transistors TR1, and store the data D2 in the capacitors C via the MOS transistors TR4 active on the word line WL1, ..., WL512.

Then, when the inversion determination circuit for twist 9 takes in a precharge command C3 for storing end, which is entered from the outside into the semiconductor storage device 1, it sends the precharge command C3 to the row decoder 11 and the column decoder 13 via the timing controller 10, so that the row decoder 11 and the column decoder 13 end the process to store the data D2 in accordance with the precharge command C3.

As described above, the row decoder 11 and the column decoder 13 are capable of storing the data D2 in the memory cells MS being connected to the word line WL1, ..., WL512 and the bit line pairs BL1, ..., BL128 specified by the row address and the line address(es), and also of sequentially storing data D2 of a prescribed amount in plural memory cells MS of the memory cell array group 2 by sequentially repeating the above storing process.

Further, in a case of normal data reproduction, the semiconductor storage device 1 receives row address data D4 specifying one row address assigned on a single word line WL1, ..., WL512 together with an active command C4 for reproduction start from the outside. The semiconductor storage device 1 takes these in the inversion determination circuit for twist 9 via the selection circuits 6 and 7.

The inversion determination circuit for twist 9 sends the active command C4 and the row address data D4 to the row decoder 11 via the timing controller 10.

As shown in FIG. 9, the row decoder 11 starts a process to set a word line WL1, ..., WL512 for data reproduction in accordance with the active command C4. In the memory cell arrays MSA10 to MSA13 of the memory cell array group 2, prescribed voltage generated by the generator 12 is applied to a single word line WL1, ..., WL512 specified by one row address based on the row address data D4, so as to set ON the MOS transistors TR4 of the memory cells MS being connected to the word line WL1, ..., WL512.

Therefore, the row decoder 11 takes and amplifies data D2 being stored, from the capacitors C via the MOS transistors TR4 through the sense amplifier SA, and then supplies the resultant to the gates of the first reproduction control transistors TR2.

In this situation, the inversion determination circuit for twist 9 takes a reproduction command C5 and line address data D5 specifying one or plural line addresses assigned to one or plural bit line pairs BL1, ..., BL128, which are entered sequentially from the outside into the semiconductor storage device 1, via the selection circuits 6 and 7, and sends the reproduction command C5 and the line address data D5 via the timing controller 10 to the column decoder 13.

At this time, as shown in FIG. 9, the column decoder 13 starts a data reproduction process in accordance with the reproduction command C5. In the memory cell arrays MSA10 to MSA13 of the memory cell array group 2, prescribed voltage generated by the generator 12 is applied to the gates of one or plural second reproduction control transistors TR3 corresponding to one or plural bit line pairs BL1, ..., BL128 specified by the one or plural line address based on the line address data D5, so as to set ON the second reproduction control transistors TR3.

When data D2 reproduced from a memory cell MS has level "0", the first reproduction control transistor TR2 supplying the data D2 becomes OFF, and the second reproduction control transistor TR3 which is set ON in this condition creates data of an instability level lower than the level "1". However, the column decoder 13 sends the data as it is to the data processing circuit 5 via the inverting circuit IV and output terminal to apply a prescribed reproduction process to the data, thereby outputting the resultant as data D2 of level "0" from the inversion processor 4 to the outside.

On the contrary, when data D2 reproduced from a memory cell MS has level "1", the first reproduction control transistor 2 supplying the data D2 becomes ON and the second reproduction control transistor TR3 which is set ON in this condition creates data of level "0" by ground. Then the column decoder 13 inverts the data of level "0" via the inverting circuit IV and sends it as data D2 of level "1" from the output terminal to the data processing circuit 5. The data processing circuit 5 applies a prescribed reproduction process to the data D2 and outputs the resultant to the outside from the inversion processor 4.

When the inversion determination circuit for twist 9 takes in a precharge command C6 for reproduction end, which is entered from the outside into the semiconductor storage device 1, via the selection circuit 6, it sends the precharge command C6 to the row decoder 11 and the column decoder 13 via the timing controller 10. Thereby the row decoder 11 and the column decoder 13 finish the reproduction process of the data D2 in accordance with the precharge command C6.

As described above, the row decoder 11 and the column decoder 13 are capable of reproducing data being stored in memory cells MS being connected to a word line WL1, . . . , WL512 and bit line pair BL1, . . . , BL128 specified by a row address and a line address, and of sequentially reproducing data D2 of a prescribed amount from each of plural memory cells MS of the memory cell array group 2 by repeatedly executing the reproduction process described above.

It should be noted that, for the normal data storage and reproduction, the semiconductor storage device 1 stores and reproduces data D2 received from the outside, in/from memory cells MS being connected to word lines WL1, . . . , WL512 and bit line pairs BL1, . . . , BL128 specified by row addresses and line addresses, without considering twists of the bit line pairs BL1, . . . , BL128.

In addition to the above technique, this semiconductor storage device 1 is subjected to cable check for the memory cells MSA10 to MSA13 of the memory cell array group 2 to see if there is a broken memory cell when manufacturing.

If a broken memory cell out of the memory cell arrays MSA10 to MSA13 is detected by the cable check, the semiconductor storage device 1 takes in a shift command C7 instructing the use of redundant memory cell regions RGAR1 to RGAR8 and row address data D6 specifying the row address assigned to the word line WL1, . . . , WL512 being connected to the broken memory cell, which are entered from the outside, in the shift processing circuit 15 via the selection circuits 6 and 7 and the inversion determination circuit for twist 9.

For the memory cell arrays MSA10 to MSA13, the shift processing circuit 15 divides the plural row addresses assigned to the plural word lines WL1, . . . , WL512 by a prescribed row address management number (for example, 8) in order, to manage them for each row address management number.

Figure 10:
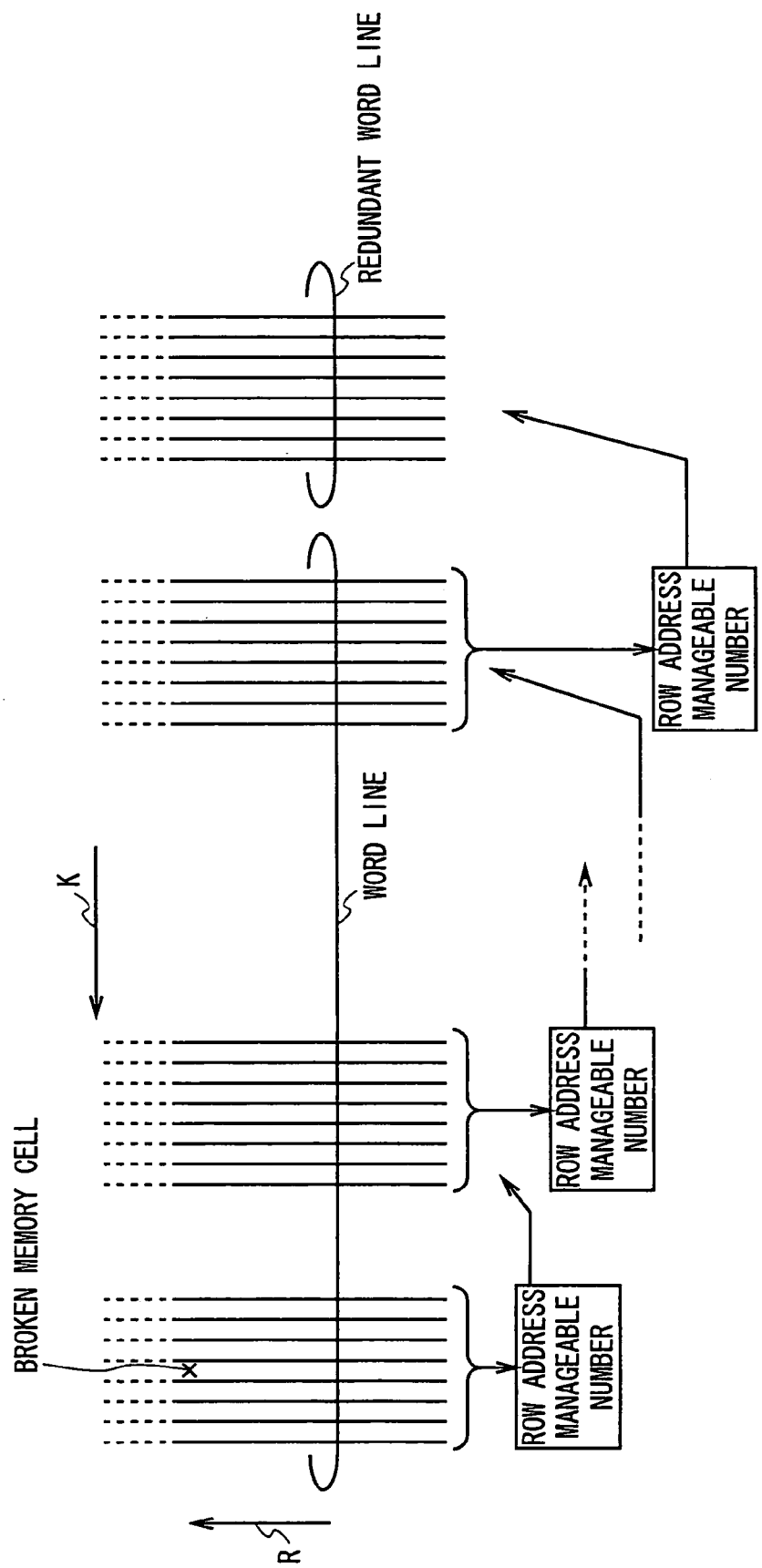
FIG. 10 is a schematic diagram explaining shift redundancy.

The shift processing circuit 15 starts a shift-redundancy process in accordance with the shift command C7. Then as shown in FIG. 10, for example, in the memory cell array MSA10 including the broken memory cell NMS, this circuit 15 physically disconnects from the row decoder 11 a number (this number is referred to as manageable number), which is equal to the row address management number, of word lines WL1, . . . , WL512 (that is, including one word line WL1, . . . , WL512 being connected to the broken memory cell NMS) being assigned the row address management number of row addresses including one row address specified by the row address data D6.

Therefore, the shift processing circuit 15 does not allow the manageable number of word lines physically disconnected from the row decoder 11 (hereinafter, referred to as disconnected word line group) WL1, . . . , WL512 and a plurality of memory cells MS including the broken memory cell NMS of prescribed rows (for example, 8 rows) equal to the row address management number, to be used later for storage and reproduction, in the memory cell array MSA10.

Further, the shift processing circuit 15 shifts, in the memory cell array MSA10, row addresses ranging from the row address management number of row addresses assigned to the disconnected word line group WL1, . . . , WL512 to the row address management number of row addresses (that is, eight addresses) assigned to the manageable number (that is, eight) of word lines WL1, . . . , WL512 located at one or the other end of the memory cell region MGAR1 in the line direction, to the manageable number of redundant word lines RWLL1, . . . , RWLL8 or RWLH1, . . . , RWLH8 locating on the one or the other side, for each row address management number.

Thereby, the shift processing circuit 15 reassigns, by shifting, the row addresses shifted (hereinafter, referred to as shifted row addresses), to word lines from the manageable number of word lines WL1, . . . , WL512 next to the disconnected word line group WL1, . . . , WL512 to the manageable number of the redundant word lines RWLL1, . . . , RWLL8 or RWLH1, . . . , RWLH8.

In this way, the shift processing circuit 15 is capable of shifting, in the memory cell array MSA10, the use regions in the line direction of the memory cells MS being connected to the word lines WL1, . . . , WL512, so as to use the redundant memory cells RMS to store or reproduce data D2 instead of a broken memory cell.

In a case where such shift-redundancy process is performed, the shift processing circuit 15 creates and keeps shift information for identifying bit line pairs BL1, . . . , BL128 of which the wire position switching parts CCAR10 and CCAR11 cross the word line WL1, . . . , WL512 or the redundant word line RWLL1, . . . , RWLL8 or RWLH1, . . . , RWLH8 specified by a row address (hereinafter, referred to as input row address) input from the outside, out of the plurality of word lines WL1, . . . , WL512 and the redundant word lines RWLL1, . . . , RWLL8 or RWLH1, . . . , RWLH8 which are reassigned the shifted row addresses.

Further, the shift processing circuit 15 previously keeps shift-redundancy information indicating whether the shift-redundancy process was executed, and changes the contents of the shift-redundancy information so as to indicate the execution of the shift-redundancy process when the shift-redundancy process is executed.

Furthermore, the shift processing circuit 15 previously keeps twist information for identifying, taking only twists into consideration, the bit line pairs BL1, . . . , BL128 of which the wire position switching parts CCAR10 and CCAR11 cross the word line WL1, . . . , WL512 specified by an input row address, out of the plurality of word lines WL1, . . . , WL512 assigned the row addresses before execution of the shift-redundancy process.

In actual, the twist information indicates, for each memory cell array MSA10 to MSA13, the row addresses assigned to a prescribed number (that is, the same number as the maximum number of row addresses shiftable) of word lines WL1, . . . , WL512 wired on one and the other ends in the line direction of each first to fourth area AREA1 to AREA4, and whether the part of each of the bit line pairs BL1, . . . , BL128 crossing the prescribed number of the word lines is the wire position nonswitching part NCAR10 to NCAR12 or the wire position switching part CCAR10 or CCAR11.

In this embodiment, the row address management number for row addresses is taken as eight, the row addresses are shifted in a unit of the row address management number, and eight redundant word lines RWLL1, . . . , RWLL8 and RWLH1, . . . , RWLH8 are wired in each redundant memory cell region RGAR1 to RGAR8. Therefore, the maximum number of shiftable row addresses is a manageable number equal to the row address management number.

The shift information stores, for each shifted row address, a shifted row address, the shift direction of the shifted row address (that is, one end direction or the other direction parallel to the line direction in the memory cell array MSA10), and the shifted amount of the shifted row address from the original row address (this is indicated by how many row addresses the row address was shifted by, with a one row address as a minimum unit).

In this embodiment, the row address management number for row addresses is taken as, for example, eight, the row addresses are shifted in a unit of the row address management number, and eight redundant word lines RWLL1, . . . , RWLL8 or RWLH1, . . . , RWLH8 are wired on the redundant memory cell regions RGAR1 to RGAR8. Therefore, the shifted amount is the row address management number.

By using the twist information independently, such bit line pairs BL1, . . . , BL128 can be identified, that of which the wire position switching parts CCAR10 and CCAR11 cross the word line WL1, . . . , WL412 specified by an input row address before execution of the shift-redundancy process.

Further, by using the shift information together with the twist information, such bit line pairs BL1, . . . , BL128 can be identified, that of which the wire position switching parts CCAR10 and CCAR11 cross the word line WL1, . . . , WL512 and the redundant word line RWLL1, . . . , RWLL8 or RWLH1, . . . , RWLH8 specified by an input row address after the execution of the shift-redundancy process.

When the semiconductor storage device 1 starts in this situation, the inversion determination circuit for twist 9 retrieves and keeps the shift-redundancy information, shift information and twist information from the shift processing circuit 15.

When the inversion determination circuit for twist 9 takes in an evaluation test execution command C8 for executing the evaluation test of data dependency, which is entered from the outside into the semiconductor storage device 1, via the selection circuit 6, it starts a data inversion determination process according to the twisting positions of the bit line pairs BL1, . . . , BL128 in accordance with the evaluation test execution command C8, and sends the shift-redundancy information, shift information and twist information to the inversion determination circuit for shift 16.

The inversion determination circuit for shift 16 starts the data inversion determination process according to the shift of the row addresses and stores the shift information and twist information when the shit redundancy information given from the inversion determination circuit for twist 9 indicates the execution of the shift-redundancy process.

Then the inversion determination circuit for twist 9 takes in, via the selection circuits 6 and 7, an active command C10 for storage start and row address data D7 specifying one input row address assigned to a single word line WL1, . . . , WL512 or redundant word line RWLL1, . . . , RWLL8 or RWLH1, . . . , RWLH8, which are entered from the outside into the semiconductor storage device 1.

The inversion determination circuit for twist 9 compares the input row address based on the row address data D7 to a plurality of row addresses before the execution of the shift-redundancy process (hereinafter, referred to as compared row addresses) based on the twist information, to determine whether the input row address is equal to, larger, or smaller than a compared row address.

Based on the determination result and the first to fourth areas AREA1 to AREA4 corresponding to the plurality of compared row addresses based on the twist information, the inversion determination circuit for twist 9 detects a wiring areas (that is, first to fourth area AREA1 to AREA4) on which the word line WL1, . . . , WL152 (that is, word line WL1, . . . , WL512 before the execution of shift-redundancy process) or redundant word line RWLL1, . . . , RWLLL8 or RWLH, . . . , RWLH8 specified by an input row address is wired.

Assume that the inversion determination circuit for twist 9 detects the first area AREA1 as a wiring area. Since all the bit line pairs twisted once (hereinafter, referred to as once-twisted bit line pairs) BL1, . . . , BL127 and the bit line pairs twisted twice (referred to as twice-twisted bit line pairs) BL2, . . . , BL128 have wire position nonswitching parts NCAR10 and NCAR11 on the first area AREA1. That is, there is no bit line pairs BL1, . . . , BL128 of which the wire position switching parts CCAR10 and CCAR11 cross a word line WL1, . . . , WL512 or redundant word line RWLL1, . . . , RWLL8 or RWLH1, . . . , RWLH8 specified by an input row address. Therefore, the circuit 9 decides not to invert the level of evaluation test data D8 to be stored, which is given to both once-twisted bit line pairs BL1, . . . , BL127 and twice-twisted bit line pairs BL2, . . . , BL128.

Then the inversion determination circuit for twist 9 sends a first input non-inverting command instructing not to invert the level of the evaluation test data D8 supplied to the once-twisted bit line pairs BL1, . . . , BL127, and a second input non-inverting command instructing not to invert the level of the evaluation test data D8 supplied to the twice-twisted bit line pairs BL2, . . . , BL128, to the inversion determination circuit for shift 16 together with the row address data D7.

Further, assume that the second area AREA2 is detected as a wiring area. Since the wire position nonswitching parts NCAR10 of the once-twisted bit line pairs BL1, . . . , BL127 and the wire position switching parts CCAR11 of the twice-twisted bit line pairs BL2, . . . , BL128 are located on the second area AREA2, the inversion determination circuit for twist 9 determines that the bit line pairs BL1, . . . , B128 of which the wire position switching parts CCAR10 and CCAR11 cross the word line WL1, . . . , WL512 or redundant word line RWLL1, . . . , RWLL8, or RWLH1, . . . , RWLH8 specified by the input row address are the twice-twisted bit line pairs BL2, . . . , BL128.

Therefore, the inversion determination circuit for twist 9 decides not to invert the level of the evaluation test data D8 supplied to the once-twisted bit line pairs BL1, . . . , BL127, and decides to invert the level of the evaluation test data D8 supplied to the twice-twisted bit line pairs BL2, . . . , BL128.

Then the inversion determination circuit for twist 9 sends a first input non-inverting command instructing not to invert the level of the evaluation test data D8 supplied to the once-twisted bit line pairs BL1, . . . , BL127 and a second input inverting command instructing to invert the level of the evaluation test data D8 supplied to the twice-twisted bit line pairs BL2, . . . , BL128, together with the row address data D7 to the inversion determination circuit for shift 16.

Furthermore, assume that the third area AREA3 is identified as a wiring area. Since all the once-twisted bit line pairs BL1, . . . , BL127 and twice-twisted bit line pairs BL2, . . . , BL128 have wire position switching parts CCAR10 and CCAR11 on the third area AREA3, the inversion determination circuit for twist 9 determines that the bit line pairs BL1, . . . , BL128 of which the wire position switching parts CCAR10 and CCAR11 cross the word line WL1, . . . , WL512 or redundant word line RWLL1, . . . , RWLL8 or RWLH1, . . . , RWLH8 specified by the input row address are the once-twisted bit line pairs BL1, ..., BL127 and twice-twisted bit line pairs BL2, ..., BL128.

Therefore, the inversion determination circuit for twist 9 decides to invert the level of the evaluation test data D8 supplied to both the once-twisted bit line pairs BL1, ..., BL127 and the twice-twisted bit line pairs BL2, ..., BL128.

Then the inversion determination circuit for twist 9 sends a first input inverting command instructing to invert the level of the evaluation test data D8 supplied to the once-twisted bit line pairs BL1, ..., BL127 and a second input inverting command instructing to invert the level of the evaluation test data D8 supplied to the twice-twisted bit line pairs BL2, ..., BL128, together with the row address data D7 to the inversion determination circuit for shift 16.

Furthermore, assume that the fourth area AREA4 is identified as a wiring area. Since the once-twisted bit line pairs BL1, ..., BL127 have the wire position switching parts CCAR10 and the twice-twisted bit line pairs BL2, ..., BL128 have the wire position nonswitching parts NCAR12 on the fourth area AREA4. Therefore, the inversion determination circuit for twist 9 identifies the bit line pairs BL1, ..., BL128 of which the wire position switching parts CCAR10, CCAR11 cross the word line WL1, ..., WL512 or redundant word line RWLL1, ..., RWLL8 or RWLH1, ..., RWLH8 specified by the input row address, as once-twisted bit line pairs BL1, ..., BL127.

Therefore, the inversion determination circuit for twist 9 decides to invert the level of the evaluation test data D8 supplied to the once-twisted bit line pairs BL1, ..., BL127 and not to invert the level of the evaluation test data D8 supplied to the twice-twisted bit line pairs BL2, ..., BL128.

Then the inversion determination circuit for twist 9 sends a first input inverting command instructing to invert the level of the evaluation test data D8 supplied to the once-twisted bit line pairs BL1, ..., BL127 and a second input non-inverting command instructing not to invert the level of the evaluation test data D8 supplied to the twice-twisted bit line pairs BL2, ..., BL128, together with the row address data D7 to the inversion determination circuit for shift 16.

The inversion determination circuit for shift 16 compares the input row address based on the row address data D7 with the plurality of shifted row addresses based on the shift information.

When the plurality of shifted row addresses does not have the same address as the input row address, the inversion determination circuit for shift 16 determines that the wiring area of the word line WL1, ..., WL512 or redundant word line RWLL1, ..., RWLL8 or RWLH1, ..., RWLH8 specified by the input row address was not changed through the shift-redundancy process. In this case, the circuit 16 sends the first and second input non-inverting commands, the first input non-inverting command and second input inverting command, the first and second input inverting commands, or the first input inverting command and second input non-inverting command, given from the inversion determination circuit for twist 9, to the inversion processor 4 as they are.

When the plurality of shifted row addresses has the same row address as the input row address, on the contrary, the inversion determination circuit for shift 16 compares the input row address with the plurality of compared row addresses based on the twist information because the wiring area of the word line WL1, ..., WL512 or redundant word line RWLL1, ..., RWLL8, or RWLH1, ..., RWLH8 specified by the input row address might be changed through the shift-redundancy process.

When the plurality of compared row addresses does not have the same address as the input row address, it means that the word line WL1, ..., WL512 or redundant word line RWLL1, ..., RW8 or RWLH1, ..., WRLH8 specified by the input row address is a word line WL1, ..., WL512 or redundant word line RWLL1, ..., RWLL8 or RWLH1, ..., RWLH8 reassigned a shifted row address through the shift-redundancy process, but a wiring area of the word line WL1, ..., WL512 or redundant word line RWLL1, ..., RWLL8 or RWLH1, ..., RWLH8 was not changed through the shift-redundancy process because the original row address was shifted to the shifted row address without passing an area boarder.

Therefore, the inversion determination circuit for shift 16 determines that the wiring area of the word line WL1, ..., W512 specified by the input row address was not changed through the shift-redundancy process, and sends the first and second input non-inverting commands, the first input non-inverting command and second input inverting command, the first and second input inverting commands, or the first input inverting command and second input non-inverting command, given from the inversion determination circuit for twist 9, to the inversion processor 4 as they are.

When the compared row addresses has the same row address as the input row address, on the contrary, it means that the compared row address identical to the input row address is a row address before shift of the shifted row address identical to the input row address.

In this case, the inversion determination circuit for shift 16 determines whether the compared row address identical to the input row address is shifted from one of the first to fourth area AREA1 to AREA4 over an area boarder with the shift-redundancy process, based on the shift direction and shift amount of the shifted row address based on the shift information and the first to fourth areas AREA1 to AREA4 corresponding to the compared row addresses based on the twist information.

When the compared row address identical to the input row address was shifted without passing an area boarder, the inversion determination circuit for shift 16 determines that the wiring area of the word line WL1, ..., WL512 specified by the input row address was not changed through the shift-redundancy process. Therefore, this circuit 16 sends the first and second input non-inverting commands, the first input non-inverting command and second input inverting command, the first and second input inverting commands, or the first input inverting command and second input non-inverting command, given from the inversion determination circuit for twist 9, to the inversion processor 4 as they are.

When the compared row address was shifted from the first area AREA1 to the second area AREA2 over the area boarder, on the contrary, the inversion determination circuit for shift 16 identifies the bit line pairs BL1, ..., BL128 of which the wire position switching parts CCAR10 and CCAR11 cross the word line WL1, ..., WL512 specified by the input row address, as twice-twisted bit line pairs BL2, ..., BL128.

As a result, out of the first and second input non-inverting commands received from the inversion determination circuit for twist 9, the inversion determination circuit for shift 16 does not change the first input non-inverting command for the once-twisted bit line pairs BL1, ..., BL127 and changes the second input non-inverting command for the twice-twisted bit line pairs BL2, ..., BL128 to the second input inverting command, and sends these first input non-inverting command and second input inverting command to the inversion processor 4.

Further, when it is determined that the compared row address was shifted from the second area AREA2 to the first area AREA1 over the area boarder, the inversion determination circuit for shift 16 determines that there is no bit line pairs BL1, ..., BL128 of which the wire position switching parts CCAR10 and CCAR11 cross the word line WL1, ..., WL5 specified by the input row address.

As a result, out of the first input non-inverting command and second input inverting command given from the inversion determination circuit for twist 9, the inversion determination circuit 16 for shift 16 does not change the first input non-inverting command for the once-twisted bit line pairs BL1, ..., BL127 and changes the second input inverting command for the twice-twisted bit line pairs BL2, ..., BL128 to the second input non-inverting command, and sends the first and second input non-inverting commands to the inversion processor 4.

Still further, when it is determined that the compared row address was shifted from the second area AREA2 to the third area AREA3 over the area boarder, the inversion determination circuit for shift 16 identifies the bit line pairs BL1, ..., BL128 of which the wire position switching parts CCAR10 and CCAR11 cross the word line WL1, ..., WL512 specified by the input row address, as the once-twisted bit line pairs BL1, ..., B127 and the twice-twisted bit line pairs BL2, ..., BL128.

As a result, out of the first input non-inverting command and the second input inverting command given from the inversion determination circuit for twist 9, the inversion determination circuit for shift 16 changes the first input non-inverting command for the once-twisted bit line pairs BL1, ..., BL127 to the first input inverting command and does not change the second input inverting command for the twice-twisted bit line pairs BL2, ..., BL128, and sends these first and second input inverting commands to the inversion processor 4.

Still further, when it is determined that the compared row address has been shifted from the third area AREA3 to the second area AREA2 over the area boarder, the inversion determination circuit for shift 6 identifies the bit line pairs BL1, ..., BL128 of which the wire position switching parts CCAR10 and CCAR11 cross the word line WL1, ..., WL512 specified by the input row address, as the twice-twisted bit line pairs BL2, ..., BL128.

As a result, out of the first and second input inverting commands given from the inversion determination circuit for twist 9, the inversion determination circuit for shift 16 changes the first input inverting command for the once-twisted bit line pairs BL1, ..., BL127 to the first input non-inverting command and does not change the second input inverting command for the twice-twisted bit line pairs BL2, ..., BL128, and sends these first input non-inverting command and second input inverting command to the inversion processor 4.

Still further, when it is determined that the compared row address was shifted from the third area AREA3 to the fourth area AREA4 over the area boarder, the inversion determination circuit for shift 16 identifies the bit line pairs BL1, ..., BL128 of which the wire position switching parts CCAR10 and CCAR11 cross the word line WL1, ..., WL512 specified by the input row address, as once-twisted bit line pairs BL1, ..., BP127.

As a result, out of the first and second input inverting commands given from the inversion determination circuit for twist 9, the inversion determination circuit for shift 16 does not change the first input inverting command for the once-twisted bit line pairs BL1, ..., BL127, changes the second input inverting command for the twice-twisted bit line pairs BL2, ..., BL128 to the second input non-inverting command, and sends these first input inverting command and second input non-inverting command to the inversion processor 4.

Still further, when it is determined that the compared row address was shifted from the fourth area AREA4 to the third area AREA3 over the area boarder, the inversion determination circuit for shift 16 identifies the bit line pairs BL1, ..., BL128 of which the wire position switching parts CCAR10 and CCAR11 cross the word line WL1, ..., WL512 specified by the input row address, as once-twisted bit line pairs BL1, ..., BP127 and twice-twisted bit line pairs BL2, ..., BL128.

As a result, out of the first input inverting command and second input non-inverting command given from the inversion determination circuit for twist 9, the inversion determination circuit for shift 16 does not change the first input inverting command for the once-twisted bit line pairs BL1, ..., BL127, and changes the second input non-inverting command for the twice-twisted bit line pairs BL2, ..., BL128 to the second input inverting command, and sends these first and second input inverting commands to the inversion processor 4.

The inversion processor 4 is provided with a first input inverting circuit which is connected to each pair of bit lines BL1A and BL1B, ..., BL127A and BL127B of the once-twisted bit line pairs BL1, ..., BL127 to invert the level of evaluation test data D8 at a time of storing data, and a second input inverting circuit which is connected to each pair of bit lines BL2A and BL2B, ..., BL128A and BL128B of the twice-twisted bit line pairs BL2, ..., BL128 to invert the level of evaluation test data D8 at a time of storing data.

In addition, the inversion processor 4 is provided with a first output inverting circuit which is connected to each pair of bit lines BL1A and BL1B, ..., BL127A and BL127B of the once-twisted bit line pairs BL1, ..., BL127 to invert the level of evaluation test data D8 at a time of reproducing data, and a second output inverting circuit which is connected to each pair of bit lines BL2A and BL2B, ..., BL128A and BL128B of the twice-twisted bit line pairs BL2, ..., BL128 to invert the level of evaluation test data D8 at a time of reproducing data.

When the inversion processor 4 receives the first and second input non-inverting commands for the first area AREA1 from the inversion determination circuit for shift 16, this processor 4 makes the first and second input inverting circuits send the evaluation test data D8 to the data processing circuit 5 as they are, without inverting the level of the evaluation test data D8.

Further, when the inversion processor 4 receives the first input non-inverting command and second input inverting command for the second area AREA2 from the inversion determination circuit for shift 16, this processor 4 makes the first input inverting circuit send the evaluation test data D8 to the data processing circuit 5 as it is, without inverting the level of the evaluation test data D8, and makes the second input inverting circuit send the evaluation test data D8 to the data processing circuit 5 after inverting the level of the evaluation test data D8.

Still further, when the inversion processor 4 receives the first and second input inverting commands for the third area AREA3 from the inversion determination circuit for shift 16, this processor 4 makes the first and second input inverting circuits send the evaluation test data D8 to the data processing circuit 5 after inverting the level of the evaluation test data D8.

Still further, when the inversion processor 4 receives the first input inverting command and second input non-inverting command for the fourth area AREA4 from the inversion determination circuit for shift 16, this processor 4 makes the first input inverting circuit send the evaluation test data D8 to the data processing circuit 5 after inverting the level of the evaluation test data D8, and makes the second input inverting circuit send the evaluation test data D8 to the data processing circuit 5 as it is, without inverting the level of the evaluation test data D8.

By the way, when the inversion determination circuit for shift 16 sends the first and second input non-inverting commands, the first input non-inverting command and second input inverting command, the first and second input inverting commands, or the first input inverting command and second input non-inverting command to the inversion processor 4, the inversion determination circuit for twist 9 sends the active command C10 and the row address data D7 to the tow decoder 11 via the timing controller 10.

Under this situation, when the inversion determination circuit for twist 9 takes in a storing command C11 and row address data D9, entered into the semiconductor storage device 1, via the selection circuits 6 and 7, it sends the storing command C11 and row address data D9 to the column decoder 13 via the timing controller 10.

At this time, the inversion processor 4 takes in the evaluation test data D8, entered from the outside into the semiconductor storage device 1, via the selection circuit 3, and sends the evaluation test data D8 to the memory cell array group 2 via the data processing circuit 5, after or without inverting the level of the evaluation test data D8 by the first and second input inverting circuits under the control described above.

Figure 11:
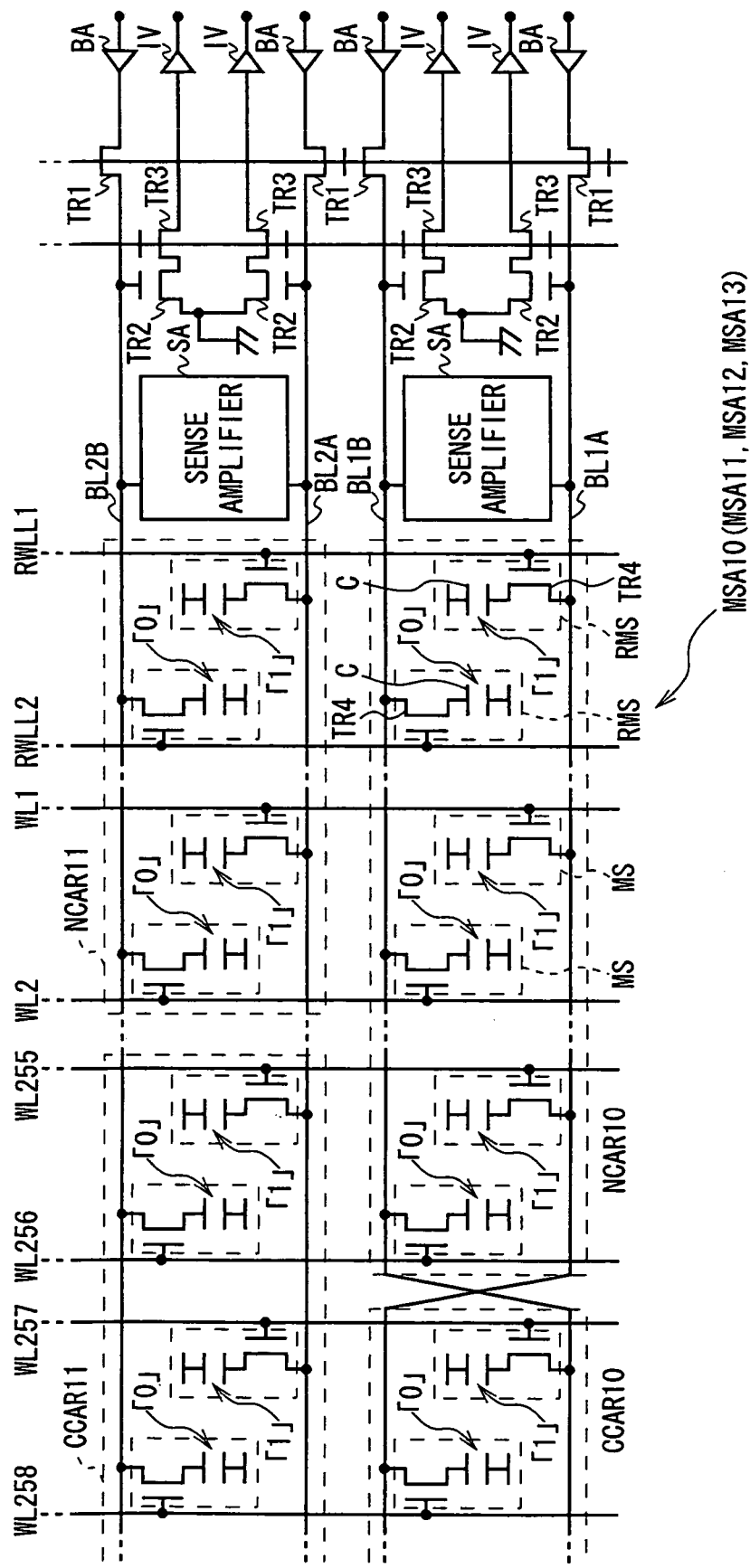
FIG. 11 is a block diagram explaining how to store evaluation test data in memory cells.

The row decoder 11 and column decoder 13 perform a storing process as in the case described above with reference to FIG. 5 and FIG. 9. Even if the shift-redundancy process is executed before the evaluation test for data dependency, the level, "0" and "1", of the evaluation test data D8 are inverted or are not inverted depending on the twisting positions and shift of row addresses in the inversion processor 4 in advance. Therefore, as shown in FIG. 11. Therefore, the evaluation test data D8 of level "0" and "1" can be stored in a prescribed storing pattern previously selected according to the physical arrangement of the memory cells MS, in a plurality of memory cells MS and redundant memory cells RMS being connected to a word line WL1, ..., WL512 or redundant word line RWLL1, ..., RWLL8 or RWLH1, ..., RWLH8 and bit line pairs BL1, ..., BL128 specified by an input row address and line addresses, in the memory cell arrays MSA10 to MSA13.

Then when the inversion determination circuit for twist 9 takes in a precharge command C12 for storing end, which is entered form the outside to the semiconductor storage device 1, via the selection circuit 6, it sends the precharge command C12 to the row decoder 11 and the column decoder 13 via the timing controller 10, thereby making the row decoder 11 and column decoder 13 finish the storing process of the evaluation test data D8 in accordance with the precharge command C12.

It should be noted that when the shift-redundancy information given from the inversion determination circuit for twist 9 indicates that the shift-redundancy process has not been executed, the inversion determination circuit for shift 16 does not execute a data inversion determination process according to the shift of row addresses, and sends the first and second input non-inverting commands, the first input non-inverting command and second input inverting command, the first and second input inverting commands, or the first input inverting command and second input non-inverting command, given from the inversion determination circuit for twist 9, to the inversion processor 4 as they are.

Even when the inversion determination circuit 9 does not perform the data inversion determination process as described above, the inversion processor 4 controls, as described above, the first and second input inverting circuits according to the first and second input non-inverting commands, the first input non-inverting command and second input inverting command, the first and second input inverting commands, or the first input inverting command and second input non-inverting command, given from the inversion determination circuit for shift 16, so as to store the evaluation test data D8 of level "0" and "1" in the storing pattern previously selected at the outside, in a plurality of memory cells MS in the memory cell arrays MSA10 to MSA13.

On the other hand, after storing the evaluation test data D8 in the plurality of memory cells MS and redundant memory cells RMS of the memory cell arrays MSA10 to MSA13, when an active command C13 for reproduction start and input row address data D10 indicating one row address specifying a single word line WL1, ..., WL512 or redundant word line RWLL1, ..., RWLL8 or RWLH1, ..., RWLH8 are sequentially entered into the semiconductor storage device 1 from the outside, the inversion determination circuit for twist 9 takes in these via the selection circuits 6 and 7.

In this case, similar to the above-described case of storing the evaluation test data D8, the inversion determination circuit for twist 9 detects a wiring area where the word line WL1, ..., WL512 or redundant word line RWLL1, ..., RWLL8 or RWLH1, ..., RWLH8 specified by the input row address based on the row address data D10 is wired.

Assume that the first area AREA1 is identified as a wiring area. There is no bit line pair BL1, ..., BL128 of which the wire position switching parts CCAR10 and CCAR11 cross the word line WL1, ..., WL512 or redundant word line RWLL1, ..., RWLL8 or RWLH1, ..., RWLH8 specified by the input row address. Therefore, the inversion determination circuit for twist 9 decides not to invert the level of the evaluation test data D8 reproduced from the once-twisted bit line pairs BL1, ..., BL127 and/or twice-twisted bit line pairs BL2, ..., BL128.

Then the inversion determination circuit for twist 9 sends a first output non-inverting command instructing not to invert the level of the evaluation test data D8 output from the once-twisted bit line pairs BL1, ..., BL127, and a second output non-inverting command instructing not to invert the level of the evaluation test data D8 output from the twice-twisted bit line pairs BL2, ..., BL128, to the inversion determination circuit for shift 16 together with the row address data D10.

Further, assume that the second area AREA2 is identified as a wiring area. The inversion determination circuit for twist 9 identifies as twice-twisted bit line pairs BL2, ..., BL128 the bit line pairs BL1, ..., BL128 of which the wire position switching parts CCAR10 and AACR11 cross the word line WL1, ..., WL512 or redundant word line RWLL1, ..., RWLL8 or RWLH1, ..., RWLH8 specified by the input row address.

Therefore, the inversion determination circuit for twist 9 decides not to invert the level of the evaluation test data D8 reproduced from the once-twisted bit line pairs BL1, ..., BL127, and to invert the level of the evaluation test data D8 reproduced from the twice-twisted bit line pairs BL2, ..., BL128.

Then the inversion determination circuit for twist 9 sends a first output non-inverting command instructing not to invert the level of the evaluation test data D8 output from the once-twisted bit line pairs BL1, ..., BL127, and a second output inverting command instructing to invert the level of the evaluation test data D8 output from the twice-twisted bit line pairs BL2, ..., BL128, together with the row address data D10 to the inversion determination circuit for shift 16.

Furthermore, assume that the third area AREA3 is identified as a wiring area. The inversion determination circuit for twist 9 identifies the bit line pairs BL1, ..., BL128 of which the wire position switching parts CCAR10 and CCAR11 cross the word line WL1, ..., WL512 or redundant word line RWLL1, ..., RWLL8 or RWLH1, ..., RWLH8 specified by the input row address, as the first twist bit line pairs BL1, ..., BL127 and the second twist bit line pairs BL2, ..., BL128.

Therefore, the inversion determination circuit for twist 9 decides to invert the level of the evaluation test data D8 reproduced from both the once-twisted bit line pairs BL1, ..., BL127 and the twice-twisted line pairs BL2, ..., BL128.

Then the inversion determination circuit for twist 9 sends a first output inverting command instructing to invert the level of the evaluation test data D8 output from the once-twisted bit line pairs BL1, ..., BL127 and a second output inverting command instructing to invert the level of the evaluation test data D8 output from the twice-twisted line pairs BL2, ..., BL128, together with the row address data D10 to the inversion determination circuit for shift 16.

Furthermore, assume that the fourth area AREA4 is identified as a wiring area. The inversion determination circuit for twist 9 identifies as once-twisted bit line pairs BL1, ..., BL127 the bit line pairs BL1, ..., BL128 of which the wire position switching parts CCAR10 and CCAR11 cross the word line WL1, ..., WL512 or redundant word line RWLL1, ..., RWLL8 or RWLH1, ..., RWLH8 specified by the input row address.

Therefore, the inversion determination circuit for twist 9 decides to invert the level of the evaluation test data D8 reproduced from the once-twisted bit line pairs BL1, ..., BL127 and not to invert the level of the evaluation test data D8 reproduced from the twice-twisted bit line pairs BL2, ..., BL128.

Then the inversion determination circuit for twist 9 sends a first output inverting command instructing to invert the level of the evaluation test data D8 output from the once-twisted bit line pairs BL1, ..., BL127 and a second output non-inverting command instructing not to invert the level of the evaluation test data D8 output from the twice-twisted bit line pairs B1L2, ..., BL128, together with the row address data D10 to the inversion determination circuit for shift 16.

Similarly to the above-described case of storing the evaluation test data D8, the inversion determination circuit for shift 16 determines whether the wiring area of the word line WL1, ..., WL512 specified by the input row address based on the row address data D10 was changed through the shift-redundancy process. When the wiring area of the word line WL1, ..., WL512 specified by the input row address was not changed through the shift-redundancy process, the circuit 16 sends the first and second output non-inverting commands, first output non-inverting command and second output inverting command, first and second output inverting commands, or first output inverting command and second output non-inverting command, given from the inversion determination circuit for twist 9, to the inversion processor 4 as they are.

When the inversion determination circuit for shift 16 determines that the wiring area of the word line WL1, ..., WL512 specified by the input row address was changed through the shift-redundancy process from the first area AREA1 to the second area AREA2, on the other hand, this circuit 16 identifies as the twice-twisted bit line pairs BL2, ..., BL128 the bit line pairs BL1, ..., BL128 of which the wire position switching parts CCAR10 and CCAR11 cross the word line WL1, ..., WL512 specified by the input row address.

Therefore, the inversion determination circuit for shift 16 does not change the first output non-inverting command out of the first and second output non-inverting commands given from the inversion determination circuit for twist 9, and changes the second output non-inverting command to the second output inverting command, and sends them to the inversion processor 4.

Further, when the inversion determination circuit for shift 16 determines that the wiring area of the word line WL1, ..., WL512 specified by the input row address was changed through the shift-redundancy process from the second area AREA2 to the first area AREA1, it determines that there is no bit line pairs BL1, ..., BL128 of which the wire position switching parts CCAR10 and CCAR11 cross the word line WL1, ..., WL512 specified by the input row address.

Therefore, the inversion determination circuit for shift 16 does not change the first output non-inverting command output of the first output non-inverting command and the second output inverting command given from the inversion determination circuit for twist 9 and changes the second output inverting command to the second non-inverting command, and sends the first and second output non-inverting commands to the inversion processor 4.

Furthermore, when the inversion determination circuit for shift 16 determines that the wiring area of the word line WL1, ..., WL512 specified by the input row address was changed through the shift-redundancy process from the second area AREA2 to the third area AREA3, it identifies the bit line pairs BL1, ..., BL128 of which the wire position switching parts CCAR10 and CCAR11 cross the word line WL1, ..., WL512 specified by the input row address, as the once-twisted bit line pairs BL1, ..., BL127 and the twice-twisted bit line pairs BL2, ..., BL128.

Therefore, the inversion determination circuit for shift 16 changes the first output non-inverting command out of the first output non-inverting command and second output inverting command given from the inversion determination circuit for twist 9, to the first output inverting command and does not change the second output inverting command, and sends these first and second output inverting commands to the inversion processor 4.

Furthermore, when the inversion determination circuit for shift 16 determines that the wiring area of the word line WL1, ..., WL512 specified by the input row address was changed through the shift-redundancy process from the third area AREA3 to the second area AREA2, it identifies as twice-twisted bit line pairs BL2, ..., BL128 the bit line pairs BL1, ..., BL128 of which the wire position switching parts CCAR10 and CCAR11 cross the word line WL1, ..., WL512 specified by the input row address.

Therefore, the inversion determination circuit for shift 16 changes, out of the first and second output inverting commands given from the inversion determination circuit for twist 9, the first output inverting command to the first output non-inverting command, and does not change the second output inverting command, and sends the first output non-inverting command and second inverting command to the inversion processor 4.

Furthermore, when the inversion determination circuit for shift 16 determines that the wiring area of the word line WL1, . . . , WL512 specified by the input row address was changed through the third area AREA3 to the fourth area AREA4, it identifies as once-twisted bit line pairs BL1, . . . , BL127 the bit line pairs BL1, . . . , BL128 of which the wire position switching parts CCAR10 and CCAR11 cross the word line WL1, . . . , WL512 specified by the input row address.

Therefore, the inversion determination circuit for shift 16 does not change the first output inverting command out of the first and second inverting commands given from the inversion determination circuit for twist 9 and changes the second output inverting command to the second output non-inverting command, and sends the first output inverting command and second output non-inverting command to the inversion processor 4.

Furthermore, when the inversion determination circuit for shift 16 determines that the wiring area of the word line WL1, . . . , WL512 specified by the input row address was changed through the shift-redundancy process from the forth area AREA4 to the third area AREA3, it identifies the bit line pairs BL1, . . . , BL128 of which the wire position switching parts CCAR10 and CCAR11 cross the word line WL1, . . . , WL512 specified by the input row address, as once-twisted bit line pairs BL1, . . . , BL127 and twice-twisted bit line pairs BL2, . . . , BL128.

Therefore, the inversion determination circuit for shift 16 does not change the first output inverting command out of the first output inverting command and second output non-inverting command given from the inversion determination circuit for twist 9, changes the second output non-inverting command to the second output inverting command, and sends the first and second output inverting commands to the inversion processor 4.

Upon reception of the first and second output non-inverting commands for the first area AREA1 from the inversion determination circuit for shift 16, the inversion processor 4 makes both the first and second output inverting circuits output the evaluation test data D8 to the outside as they are, without performing the inversion process.

Further, upon reception of the first output non-inverting command and second output inverting command for the second area AREA2 from the inversion determination circuit for shift 16, the inversion processor 4 makes the first output inverting circuit output the evaluation test data to the outside without performing the inversion process, and makes the second output inverting circuit invert and output the evaluation test data D8 to the outside.

Furthermore, upon reception of the first and second output inverting commands for the third area AREA3 from the inversion determination circuit for shift 16, the inversion processor 4 makes both the first and second output inverting circuits invert and output the evaluation test data D8 to the outside.

Furthermore, upon reception of the first output inverting command and second output non-inverting command for the fourth area AREA4 from the inversion determination circuit for shift 16, the inversion processor 4 makes the first output inverting circuit invert and output the evaluation test data D8 and makes the second output inverting circuit output the evaluation test data D8 to the outside without performing the inversion process.

When the inversion determination circuit for shift 16 sends the first and second output non-inverting commands, the first output non-inverting command and second output inverting command, the first and second output inverting commands, or the first output inverting command and second output non-inverting command to the inversion processor 4, the inversion determination circuit for twist 9 sends the active command C13 and the row address data D10 to the row decoder 11 through the timing controller 10.

When the inversion determination circuit for twist 9 takes in the reproduction command C14 and the row address data D11, which are entered into the semiconductor storage device 1, via the selection circuits 6 and 7, it sends the reproduction command C14 and the row address data D11 to the column decoder 13 through the timing controller 10.

Thereby, the row decoder 11 and the column decoder 13 execute the reproduction process as in the case described above with reference to FIG. 5, and FIG. 9, to reproduce the evaluation test data D8 of level "0", "1", from the plurality of memory cells MS and redundant memory cells RMS being connected to the word line WL1, . . . , WL512 or redundant word line RWLL1, . . . , RWLL8 or RWLH1, . . . , RWLH8 specified and the bit line pairs BL1, . . . , BL128 specified by the input row address and line addresses, in the memory cell array MSA10 to MSA13, and send the data D8 to the inversion processor 4 via the data processing circuit 5.

Then the inversion processor 4 makes the first and second output inverting circuits output the evaluation test data D8 given from the memory cell array group 2 via the data processing circuit 5, to the outside after or without the inversion process according to the control described above.

As a result, even when the evaluation test data D8 entered from the outside is stored in the storing pattern in a plurality of memory cells MS and redundant memory cells RMS after appropriately inverting the level of the data D8 according to the shift-redundancy process executed before the evaluation test for data dependency, the inversion processor 4 appropriately inverts the evaluation test data D8 reproduced from the plurality of memory cells MS and redundant memory cells RMS again, thus making it possible to offset the inversion executed at the time of storage.

When the inversion determination circuit for twist 9 takes in the precharge command C15 for reproduction end, which is entered from the outside into the semiconductor storage device 1, via the selection circuit 6, it sends the precharge command C15 to the row decoder 11 and the column decoder 13 via the timing controller 10, so that the row decoder 11 and the column decoder 13 finish the reproduction process of the evaluation test data D8 in accordance with the precharge command C15.

When the shift-redundancy information given from the inversion determination circuit for twist 9 indicates that the shift-redundancy process has not been executed, the inversion determination circuit for shift 16 sends the first and second output non-inverting commands, the first output non-inverting command and second output inverting command, the first and second output inverting commands, or the first output inverting command and second output non-inverting command given from the inversion determination circuit for twist 9, to the inversion processor 4 as they are, without performing the data inversion determination process according to the shift of the row addresses as in the above-described case of storing the evaluation test data D8.

Therefore, even when the data inversion determination process is not executed by the inversion determination circuit for shift 16, the inversion processor 4 controls the first and second output inverting circuits based on the first and second output non-inverting commands, the first output non-inverting command and second output inverting command, the first and second output inverting commands, or the first output inverting command and second output non-inverting command given from the inversion determination circuit for shift 16, as described above, so as to output the evaluation test data D8 reproduced from the plurality of memory cells MS of the memory cell arrays MSA10 to MSA13 to the outside by offsetting the inversion executed at the time of storage.

In actual, as shown in FIGS. 12A to 12L, each circuit of the semiconductor storage device 1 operates according to a standard operation clock generated by the timing generator 9 while storing the evaluation test data D8 (FIG. 12A).

When the inversion determination circuit for twist 9 takes in the active command C10 and row address data D7 from the outside in this situation (FIGS. 12B and 12C), it executes the data inversion determination process according to twisting positions described above.

As a result of the data inversion determination process according to the shift of row addresses after the data inversion determination process according to the twisting positions by the inversion determination circuit for twist 9, assume that the row addresses assigned to the word lines WL1, . . . , WL512 on the first area AREA1 are reassigned to other word lines WL1, . . . , WL512 of the second area AREA2 in the memory cell array MSA10. The inversion determination circuit for shift 16 changes the second input non-inverting command out of the first and second input non-inverting commands given from the inversion determination circuit for twist 9 to the second input inverting command, and sends the first input non-inverting command and the second input inverting command to the inversion processor 4 (FIG. 12F).

Then when the inversion processor 4 starts to takes in the first input non-inverting command and second input inverting command given from the inversion determination circuit for shift 16, it controls the first input inverting circuit for the once-twisted bit line pairs BL1, . . . , BL127 so as not to invert the evaluation test data D8, and controls the second input inverting circuit for the twice-twisted bit line pairs BL2, . . . , BL128 so as to invert the evaluation test data D8 (FIG. 12H) although it was determined once that the inversion process was not to be performed (dotted line in FIG. 12H).

In addition, when the inversion determination circuit for shift 16 starts to send the first input non-inverting command and second input inverting command to the inversion processor 4, the inversion determination circuit for twist 9 sends the active command C10 and the row address data D7 to the row decoder 11.

Therefore, almost at the same time when the inversion determination circuit for shift 16 sends the first input non-inverting command and second input inverting command to the inversion processor 4, the row decoder 11 starts to apply prescribed voltage generated by the generator 12 to a single word line WL1, . . . , WL512 which is specified by one input row address based on the row address data D7 and wired on the second area AREA2 (FIGS. 12D and 12E).

Then when the inversion determination circuit for twist 9 takes the storing command C11 and the row address data D9, which are entered from the outside (FIGS. 12B and 12C), it sends them to the column decoder 13.

Therefore, at almost the same time when the inversion determination circuit for twist 9 takes in the storing command C11 and line address data D9, the column decoder 13 sets ON the storing control transistors TR1 at the input/output stages of the once-twisted bit line pairs BL1, . . . , BL127 and twice-twisted bit line pairs BL2, . . . , BL128 specified by the line addresses based on the line address data D9.

Further, at almost the same time when the inversion determination circuit for twist 9 takes in the storing command C11 and line address data D9, the inversion processor 4 takes in the evaluation test data D8 to be stored in the memory cells MS through the once-twisted bit line pairs BL1, . . . , BL127 (FIG. 12I), and takes in the evaluation test data D8 to be stored in the memory cells MS through the twice-twisted bit line pairs BL2, . . . , BL128 (FIG. 12J), which are supplied from the outside. Then, it gives the taken evaluation test data D8 as it is to the once-twisted bit line pairs BL1, . . . , BL127 of the memory cell array MSA10 without inverting the level of the data D8 by the first input inverting circuit to store it in the memory cells MS (FIG. 12K), and gives the evaluation test data D13 obtained through the inversion process of the second input inverting circuit to the twice-twisted bit line pairs BL2, . . . , BL128 of the memory cell array MSA10 to store it in the memory cells MS (FIG. 12L).

After this, when the inversion determination circuit for twist 8 takes in the precharge command C12 from the outside (FIG. 12B), it sends the precharge command C12 to the inversion determination circuit for shift 16, row decoder 11 and column decoder 13.

Thereby, at almost the same time when the inversion determination circuit for twist 9 takes in the precharge command C12, the inversion determination circuit for shift 16 stops the transmission of the first input non-inverting command and second input inverting command to the inversion processor 4 (FIG. 12F), so that the inversion processor 4 stops controlling the first and second input inverting circuits (FIG. 12H).

Further, at almost the same time when the inversion determination circuit for twist 9 takes in the precharge command C12, the row decoder 11 and column decoder 13 finish the storing process of the evaluation test data D8 by using the word line WL1, . . . , WL512 specified by the input row address (FIG. 12D).

By the way, as shown in FIGS. 13A to 13L, as a result of the data inversion determination process, for example, assume that the row addresses assigned to the word lines WL1, . . . , WL512 wired on the second area AREA2 in the memory cell array MSA10 are reassigned to other word lines WL1, . . . , WL512 wired on the first area AREA1 as the shifted row addresses through the shift-redundancy process. the inversion determination circuit for shift 16 changes, out of the first input non-inverting command and the second input inverting command given from the inversion determination circuit for twist 9, the second input inverting command to the second input non-inverting command, and then starts the transmission of the first and second input non-inverting commands to the inversion processor 4 (FIG. 13G).

Upon reception of the first and second input non-inverting commands from the inversion determination circuit for shift 16, the inversion processor 4 starts to control the first input inverting circuit so as not to invert the evaluation test data D8, and to control the second input inverting circuit so as not to invert the evaluation test data D8 (FIG. 13H) although it was decided once the inversion process was to be performed (dotted line in FIG. 13H).

Further, when the inversion determination circuit for shift 16 starts to send the first and second input non-inverting commands to the inversion processor 4, the inversion determination circuit for twist 9 sends the active command C10 and row address data D7 to the row decoder 11.

Therefore, at almost the same time when the inversion determination circuit for shift 16 starts to send the first and second input non-inverting commands to the inversion processor 4, the row decoder 11 starts to apply prescribed voltage generated by the generator 12 to a single word line WL1, . . . , WL512 which is specified by one input row address based on the row address data D7 and is wired on the first area AREA1, in the memory cell array MSA10 (FIGS. 13D and 13E).

When the inversion determination circuit for twist 9 takes in the storing command C11 and row address data D9, which are entered from the outside (FIG. 13B and 13C), sends these to the column decoder 13.

Therefore, at almost the same time when the inversion determination circuit for twist 9 takes in the storing command C11 and line address data D9, the column decoder 13 sets ON the storing control transistors TR1 at the input/output stages of the once-twisted bit line pairs BL1, . . . , BL127 and twice-twisted bit line pairs BL2, . . . , BL128 specified by the line addresses based on the line address data D9.

In addition, at almost the same time when the inversion determination circuit for twist 9 takes in the storing command C11 and line address data D9, the inversion processor 4 takes in the evaluation test data D8 to be stored in the memory cells MS through the once-twisted bit line pairs BL1, . . . , BL127 (FIG. 13I) and takes in the evaluation test data D8 to be stored in the memory cells MS through the twice-twisted bit line pairs BL2, . . . , BL128 (FIG. 13J). Then it controls the first input inverting circuit so as to give the evaluation test data D8 to the once-twisted bit line pairs BL1, . . . , BL127 of the memory cell array MSA10 without inverting the level of the data D8 to store it in the memory cells MS (FIG. 13K), and controls the second input inverting circuit so as to give the evaluation test data D8 to the twice-twisted bit line pairs BL2, . . . , BL128 of the memory cell array MSA10 without the inversion process to store it in the memory cells MS (FIG. 13L).

On the other hand, as shown in FIGS. 14A to 14L, each circuit of the semiconductor storage device 1 operates according to the standard operation clock generated by the timing generator 9 while reproducing the evaluation test data D8 (FIG. 14A).

When the inversion determination circuit for twist 9 takes in the active command C13 and row address data D10 from the outside in this situation (FIG. 14B and 14C), it executes the data inversion determination process according to the twisting positions described above.

As a result of the data inversion determination process according to the shift of row addresses, for example, assume that row addresses assigned to the word lines WL1, . . . , WL512 wired on the first area AREA2 in the memory cell array MSA10 are reassigned to other word lines WL1, . . . , WL512 wired on the second area AREA1 as shifted row addresses through the shift-redundancy process. The inversion determination circuit for shift 16 changes, out of the first and second output non-inverting commands given from the inversion determination circuit for twist 9, the second output non-inverting command to the second output inverting command, and starts to send the first output non-inverting command and second output inverting command to the inversion processor 4 (FIG. 14F).

Then when the inversion processor 4 receives the first output non-inverting command and second output inverting command from the inversion determination circuit for shift 16, this processor 4 starts to control the first output inverting circuit for the once-twisted bit line pairs BL1, . . . , BL127 so as not to invert the evaluation test data D8, and to control the second output inverting circuit for the twice-twisted bit line pairs BL2, . . . , BL128 so as to invert the evaluation test data D13 (FIG. 14H) although it was decided that the inversion process was not to be performed (dotted line in FIG. 14H).

When the inversion determination circuit for shift 16 starts to send the first output non-inverting command and second output inverting command to the inversion processor 4, the inversion determination circuit for twist 9 sends the active command C13 and row address data D10 to the row decoder 11.

Therefore, at almost the same time when the inversion determination circuit for shift 16 starts to send the first output non-inverting command and second output inverting command to the inversion processor 4, the row decoder 11 starts to apply prescribed voltage generated by the generator 12 to a single word line WL1, . . . , WL512 which is specified by one input row address based on the row address data D10 and is wired on the second area AREA2, for example, in the memory cell array MSA10 (FIGS. 14D and 14E), thus taking the evaluation test data D8 and D13 out of the memory cells MS and giving them to the gates of the first reproduction transistors TR2.

Then when the inversion determination circuit for twist 9 takes in the reproduction command C14 and line address data D11 from the outside (FIGS. 14B and 14C), it sends these to the column decoder 13.

At almost the same time when the inversion determination circuit for twist 9 takes in the reproduction command C14 and line address data D11, the column decoder 13 sets ON the second reproduction control transistors TR3 of the once-twisted bit line pairs BL1, . . . , BL127 and twice-twisted bit line pairs BL2, . . . , BL128 specified by the line addresses based on the line address data D11, so as to send the evaluation test data D8 through the once-twisted bit line pairs BL1, . . . , BL127 to the inversion processor 4 (FIG. 14I) and to send the evaluation test data D13 through the twice-twisted bit line pairs BL2, . . . , BL128 to the inversion processor 4 (FIG. 14J).

Therefore the inversion processor 4 makes the first output inverting circuit for the once-twisted bit line pairs BL1, . . . , BL127 output the evaluation test data D8 to the outside without inverting the level of the data (FIG. 14K), and makes the second output inverting circuit for the twice-twisted bit line pairs BL2, . . . , BL128 output the evaluation test data D13 after inverting the level of the data D13 to the outside (FIG. 14L).

Then when the inversion determination circuit for twist 9 takes in the precharge command C15 from the outside (FIG. 14B), it sends this command C15 to the inversion determination circuit for shift 16, row decoder 11 and column decoder 13.

Therefore, at almost the same time when the inversion determination circuit for twist 9 takes in the precharge command C15, the inversion determination circuit for shift 16 stops sending the first output non-inverting command and the second output inverting command to the inversion processor (FIG. 14F), so that the inversion processor 4 stops controlling the first and second output inverting circuits (FIG. 14H).

In addition, at almost the same time when the inversion determination circuit for twist 9 takes in the precharge command C15, the row decoder 11 and column decoder 13 finish the reproduction of the evaluation test data D8 and D13 by using the word line WL1, . . . , WL512 specified by the input row address (FIG. 14D).

By the way, as shown in FIGS. 15A to 15L, as a result of the data inversion determination process according to the shift of the row addresses, assume that the row addresses assigned to the word lines WL1, . . . , WL512 wired on the second area AREA2 in the memory cell array MSA10 are reassigned to other word lines WL1, . . . , WL512 wired on the first area AREA1 as shifted row addresses through the shift-redundancy process. The inversion determination circuit for shift 16 changes, out of the first output non-inverting command and second output inverting command given from the inversion determination circuit for twist 9, the second output inverting command to the second output non-inverting command, and starts to send the first and second output non-inverting commands to the inversion processor 4 (FIG. 15G).

Then when the inversion processor 4 starts to receive the first and second output non-inverting commands from the inversion determination circuit for shift 16, it starts to control the first output inverting circuit so as not to invert the evaluation test data D8, and to control the second output inverting circuit so as not to invert the evaluation test data D8 (FIG. 15H) although it was determined once that the inversion process was to be performed (dotted line in FIG. 15H).

When the inversion determination circuit for shift 16 starts to send the first and second output non-inverting commands to the inversion processor 4, the inversion determination circuit for twist 9 sends the active command C13 and row address data D10 to the row decoder 11.

Therefore, at almost the same time when the inversion determination circuit for shift 16 starts to send the first and second output non-inverting commands to the inversion processor 4, the row decoder 11 starts to apply prescribed voltage generated by the generator 12 to a single word line WL1, . . . , WL512 which is specified by one input row address based on the row address data D7 and wired on the first area AREA1 (FIGS. 15D and 15E), thus taking the evaluation test data D8 out of the memory cells MS and giving them to the gates of the first reproduction control transistors TR2.

Then the inversion determination circuit for twist 9 takes in the reproduction command C14 and line address data D11 from the outside (FIGS. 14B and 14C) and sends them to the column decoder 13.

At almost the same time when the inversion determination circuit for twist 9 takes in the reproduction command C14 and line address data D11, the column decoder 13 sets ON the reproduction control transistors TR3 of the once-twisted bit line pairs BL1, . . . , BL127 and twice-twisted bit line pairs BL2, . . . , BL128 specified by the line addresses based on the line address data D11, thus sending the evaluation test data D8 from the once-twisted bit line pairs BL1, . . . , BL127 to the inversion processor 4 (FIG. 14I) and sending the evaluation test data D8 from the twice-twisted bit line pairs BL2, . . . , BL128 to the inversion processor 4 (FIG. 14J).

Therefore the inversion processor 4 makes the first output inverting circuit for the once-twisted bit line pairs BL1, . . . , BL127 output the evaluation test data D8 to the outside without inverting the level of the data D8 (FIG. 14K), and makes the second output inverting circuit for the twice-twisted bit line pairs BL2, . . . , BL128 output the evaluation test data D8 to the outside without inverting the level of the data D8 (FIG. 14L).

Note that, in this case, the semiconductor storage device 1 (FIG. 5) is provided with a test circuit 17 which functions when an acceleration test called a burn-in test is performed in a state of receiving test driving voltage higher or lower than driving voltage for normal operation as power voltage.

In this case, when the test circuit 17 receives a command to execute the acceleration test from the outside in a state where the test driving voltage is applied to the semiconductor storage device 1, it sends an acceleration test command C20 to the inversion determination circuit for twist 9 via the selection circuit 6 accordingly, so as to make the inversion determination circuit for twist 9 start the data inversion determination process according to the twisting positions as described above and to make the inversion determination circuit for shift 16 start the data inversion determination process according to the shift of the row addresses as described above.

Then, similarly to the above-described case of storing the evaluation test data D8, the test circuit 17 creates and sends the active command C10, storing command C11 and precharge command C12 to the inversion determination circuit for twist 9 via the selection circuit 6, and creates and sends the row address data D7 and line address data D9 to the inversion determination circuit for twist 9 via the selection circuit 7.

In addition, the test circuit 17 creates and sends acceleration test data D15 to the inversion processor 4 via the selection circuit 3.

Thus, the test circuit 17 can make each circuit of latter stages store the acceleration test data D15 in memory cells MS and redundant memory cells RMS of the memory cell array group 2, similarly to the above-described evaluation test case.

In addition, after storing the acceleration test data D15 in the memory cells MS and redundant memory cells RMS, the test circuit 17 creates and sends the active command C13, reproduction command C14 and precharge command C15, which are the same as those in the above-described case of reproducing the evaluation test data D8, to the inversion determination circuit for twist 9 via the selection circuit 6 and also creates and sends the row address data D10 and line address data D11 to the inversion determination circuit for twist 9 via the selection circuit 7.

Thus, similarly to the above-described evaluation test case, the test circuit 17 is able to make each circuit of the latter stages reproduce and output the acceleration test data D15 from the memory cells MS and redundant memory cells RMS of the memory cell array group 2 to the outside, thus making it possible to execute the acceleration test while giving stress to the memory cells MS and redundant memory cells RMS, as in the evaluation test case, and to make a prescribed external test device evaluate the semiconductor storage device 1 through the acceleration test.

In this connection, in a state where the test driving voltage is applied to the semiconductor storage device 1, the test circuit 17 creates and sends prescribed data as well as the same commands as the above-described cases of normal data storage and data reproduction, to each circuit of the latter stages, thus making it possible to make the inversion determination circuit for twist 9 and the inversion determination circuit or shift 16 execute the storing/reproduction process of acceleration test data without the data inversion determination process according to the twisting positions and the data inversion determination process according to the shift of the row addresses.

Note that the test circuit 17 is designed to be able to control the selection circuits 3, 6, and 7 so as to select data and command to be given to the inversion determination circuit for twist 9 and the inversion processor 4, out of data and commands given from the outside and data and commands created by the own circuit.

Further, the semiconductor storage device 1 can execute the acceleration test by using not only the test circuit 17 but also commands and data given from the outside, similarly to the case using the test circuit 17.

Figure 16:
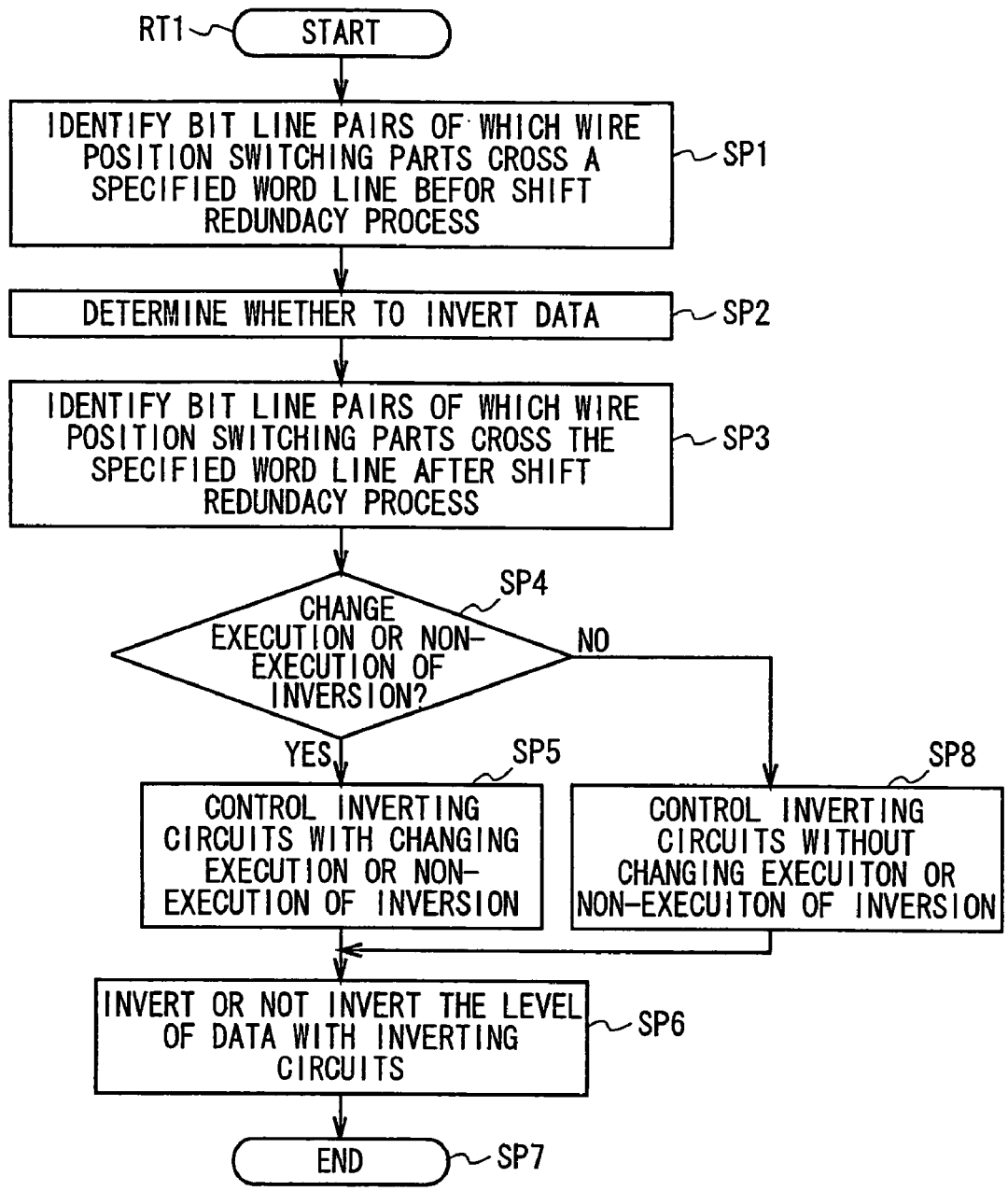
FIG. 16 is a flowchart showing a procedure of a data inversion control process.

According to the above construction, in the semiconductor storage device 1, at the time of storing evaluation test data D8, the inversion determination circuit for twist 9 identifies the bit line pairs BL1, . . . , BL128 of which the wire position switching parts CCAR10 and CCAR11 cross the word line WL1, . . . , WL512 or redundant word line RWLL1, . . . , RWLL8 or RWLH1, . . . , RWLH8 specified by an input row address before the execution of the shift-redundancy process (step SP1 in FIG. 16), and determines based on the identification result whether to invert the evaluation test data D8 to be supplied to the once-twisted bit line pairs BL1, . . . , BL127 and the twice-twisted bit line pairs BL2, . . . , BL128 (step SP2 in FIG. 16).

Then in the semiconductor storage device 1, the inversion determination circuit for shift 16 identifies the bit line pairs BL1, . . . , BL128 of which the wire position switching parts CCAR10 and CCAR11 cross the word line WL1, . . . , WL512 or redundant word line RWLL1, . . . , RWLL8 or RWLH1, . . . , RWLH8 specified by the input row address after the execution of the shift-redundancy process (step SP3 in FIG. 16), and determines based on the identification result whether to invert the evaluation test data D8 to be supplied to the once-twisted bit line pairs BL1, . . . , BL127 and the twice-twisted bit line pairs BL2, . . . , BL128 (step SP4 in FIG. 16).

As a result, in the semiconductor storage device 1, when the bit line pairs BL1, . . . , BL128 of which the wire position switching parts CCAR10 and CCAR11 cross the word line WL1, . . . , WL512 specified by the input row address have been changed through the shift-redundancy process, the inversion determination circuit for shift 16 controls the first and second input inverting circuits of the inversion processor 4 with changing the execution or non-execution of the inversion process of the evaluation test data D8 to be supplied to the once-twisted bit line pairs BL1, . . . , BL127 and twice-twisted bit line pairs BL2, . . . , BL128 (step S5 in FIG. 16).

Then in the semiconductor storage device 1, the evaluation test data D8 entered from the outside is supplied to the once-twisted bit line pairs BL1, . . . , BL127 with or without inverting the level of the data D8 by the first input inverting circuit, and also the evaluation test data D8 is supplied to the twice-twisted bit line pairs BL2, . . . , BL128 with or without inverting the level of the data D8 by the second input inverting circuit, so that the evaluation test data D8 is stored in a plurality of memory cells MS and redundant memory cells RMS on the word line WL1, . . . , WL512 (Step SP6 in FIG. 16), and the storing process of the evaluation test data D8 in the memory cells MS and redundant memory cells RMS ends (step SP7 in FIG. 16).

By the way, in the semiconductor storage device 1, when the bit line pairs BL1, . . . , BL128 of which the wire position switching parts CCAR10 and CCAR11 cross the word line WL1, . . . , WL512 or redundant word line RWLL1, . . . , RWLL8 or RWLH1, . . . , RWLH8 specified by the input row address has not been changed through the shift-redundancy process, the inversion determination circuit for shift 16 controls the first and second input inverting circuits without changing the execution or non-execution of the inversion process of the evaluation test data D8 to be supplied to the once-twisted bit line pairs BL1, . . . , BL127 and twice-twisted bit line pairs BL2, . . . , BL128 (step SP8 in FIG. 16).

Then in the semiconductor storage device 1, the evaluation test data D8 entered from the outside is supplied to the once-twisted bit line pairs BL1, . . . , BL127 with or without inverting the level of the data D8 by the first input inverting circuit and the evaluation test data D8 is supplied to the twice-twisted bit line pairs BL2, . . . , BL128 with or without inverting the level of the data D8 by the second input inverting circuit, so that the evaluation test data D8 is stored in a plurality of memory cells MS on the word line WL1, . . . , WL512 or redundant word line RWLL1, . . . , RWLL8 or RWLH1, . . . , RWLH8 (step SP6 in FIG. 16).

At the time of reproducing the evaluation test data D8, on the other hand, in the semiconductor storage device 1, similarly to the above-described case of storing the evaluation test data D8, the inversion determination circuit for twist 9 identifies the bit line pairs BL1, . . . , BL128 of which the wire position switching parts CCAR10 and CCAR11 cross the word line WL1, . . . , WL512 or redundant word line RWLL1, . . . , RWLL8 or RWLH1, . . . , RWLH8 specified by an input row address before the execution of the shift-redundancy process (step SP1 in FIG. 16), and determines based on the identification result whether to invert the evaluation test data D8 reproduced from the once-twisted bit line pairs BL1, . . . , BL127 and twice-twisted bit line pairs BL2, . . . , BL128 (step SP2 in FIG. 16).

Then, similarly to the above-described case of storing the evaluation test data D8, in the semiconductor storage device 1, the inversion determination circuit for shift 16 identifies the bit line pairs BL1, . . . , BL128 of which the wire position switching parts CCAR10 and CCAR11 cross the word line WL1, . . . , WL512 or redundant word line RWLL1, . . . , RWLL8 or RWLH1, . . . , RWLH8 specified by the input row address (step SP3 in FIG. 16), and determines based on the identification result whether to invert the evaluation test data D8 reproduced from the once-twisted bit line pairs BL1, . . . , BL127 and twice-twisted bit line pairs BL2, . . . , BL128 (step SP4 in FIG. 16).

As a result, in the semiconductor storage device 1, when the bit line pairs BL1, . . . , BL128 having the wire position switching parts CCAR10 and CCAR11 cross the word line WL1, . . . , WL512 specified by the input row address has been changed through the shift-redundancy process, the inversion determination circuit for shift 16 controls the first and second output inverting circuits of the inversion processor 4 with changing the execution or non-execution of the inversion process of the evaluation test data D8 reproduced from the once-twisted bit line pairs BL1, . . . , BL127 and the twice-twisted bit line pairs BL2, . . . , BL128 (step SP5 in FIG. 16).

Then in the semiconductor storage device 1, the evaluation test data D8 reproduced from the memory cells MS and redundant memory cells RMS through the once-twisted bit line pairs BL1, . . . , BL127 is output to the outside with or without inverting the level of the data D8 by the first output inverting circuit, and the evaluation test data D8 reproduced from the memory cells MS and redundant memory cells RMS through the twice-twisted bit line pairs BL2, ..., BL128 is output to the outside with or without inverting the level of the data D8 by the second output inverting circuit (step SP6 in FIG. 16). Then the reproduction process of the evaluation test data D8 from the memory cells MS and redundant memory cells RMS ends (step S7 in FIG. 16).

By the way, in the semiconductor storage device 1, when the bit line pairs BL1, ..., BL128 of which the wire position switching parts CCAR10 and CCAR11 cross the word line WL1, ..., WL412 or redundant word line RWLL1, ..., RWLL8 or RWLH1, ..., RWLH8 specified by the input row address have not been changed through the shift-redundancy process, the inversion determination circuit for shift 16 controls the first and second output inverting circuits without changing the execution or non-execution of the inversion process of the evaluation test data D8 reproduced from the once-twisted bit line pairs BL1, ..., BL127 and twice-twisted bit line pairs BL2, ..., BL128 (step SP8 in FIG. 16).

Then in the semiconductor storage device 1, the evaluation test data D8 reproduced from the memory cells MS and redundant memory cells RMS through the once-twisted bit line pairs BL1, ..., BL127 is output to the outside with or without inverting the level of the data D8 by the first output inverting circuit, and the evaluation test data D8 reproduced from the memory cells MS and redundant memory cells RMS through the twice-twisted bit line pairs BL2, ..., BL128 is output to the outside with or without inverting the level of the data D8 by the second output inverting circuit (step SP6 in FIG. 16).

As a result, in the semiconductor storage device 1, by appropriately inverting or non-inverting the level of the evaluation test data D8 according to the twisting positions of the bit line pairs BL1, ..., BL128 and the shift of the row addresses assigned to the word lines WL1, ..., WL512, the evaluation test data D8 can be properly stored in a plurality of memory cells MS and redundant memory cells RMS in a storing pattern selected at the outside according to the physical arrangement of the plurality of memory cells MS in the memory cell arrays MSA10 to MSA13.

To reproduce the evaluation test data D8 stored in a the plurality of memory cells MS and redundant memory cells RMS in the storing pattern, in the semiconductor storage device 1, the level of the reproduced evaluation test data D8 is appropriately inverted or not inverted according to the twisting positions of the bit line pairs BL1, ..., BL128 and the shift of the row addresses assigned to the word lines WL1, ..., WL512 again, thereby restoring and outputting the original evaluation test data D8 to the outside.

As a result, the semiconductor storage device 1 allows a prescribed external evaluation device to correctly evaluate data dependency to a plurality of memory cells MS and redundant memory cells RMS by comparing the storing pattern of the evaluation test data D8 before storage with the reproduction pattern of the evaluation test data D8 after reproduction, without considering the twisting positions of the bit line pairs BL1, ..., BL128 and the shift of the row addresses in the physical arrangement of the plurality of memory cells MS and redundant memory cells RMS.

According to the above configuration, at the time of storing the evaluation test data D8, the bit line pairs BL1, ..., BL128 of which the wire position switching parts CCAR10 and CCAR11 cross the word line WL1, ..., WL512 specified by an input row address are identified based on the twisting positions of the bit line pairs BL1, ..., BL128 and the shift of the row addresses, and the evaluation test data D8 is supplied to the bit line pairs BL1, ..., BL128 after or without inverting the level of the data D8 depending on the identification result in order to be stored in a plurality of memory cells MS and redundant memory cells RMS. At the time of reproducing the evaluation test data D8, the bit line pairs BL1, ..., BL128 of which the wire position switching parts CCAR10 and CCAR11 cross the word line WL1, ..., WL512 specified by an input row address are identified based on the twisting positions of the bit line pairs BL1, ..., BL128 and the shift of the row addresses, and the evaluation test data D8 reproduced from the plurality of memory cells MS and redundant memory cells RMS of the memory cell arrays MSA10 to MSA13 is output to the outside after or without inverting the level of the data D8 depending on the identification result. As a result, evaluation test data D8 entered from the outside can be properly stored in a plurality of memory cells MS and redundant memory cells RMS in a previously selected storing pattern, and the evaluation test data D8 reproduced form the plurality of memory cells MS and redundant memory cells RMS can be output to the outside by offsetting the inversion executed at the time of storage, thus making it possible to realize a semiconductor storage device capable of being evaluated correctly.

Further, data dependency of the semiconductor storage device 1 can be correctly evaluated during manufacturing, which can previously avoid broken devices from being on the market due to insufficient evaluation.

Still further, the semiconductor storage device 1 can store and reproduce acceleration test data D15 in the acceleration test as in the case of the evaluation test, thus making it possible to efficiently perform the acceleration test and the evaluation test.

Still further, the semiconductor storage device 1 is provided with the test circuit 17, so as to reduce the processing loads in the acceleration test to an external test device.

Still further, in the semiconductor storage device, the inversion determination circuit for twist 9 executes the data inversion determination process according to the twisting positions to determine whether to invert the evaluation test data D8 and the inversion determination circuit for shift 16 executes the data inversion determination process according to the shift of the row addresses to finally determine whether to invert the evaluation test data D8. Therefore, even in a case where the shift-redundancy process is not performed, only the data inversion determination process according to the twisting positions by the inversion determination circuit for twist 9 correctly determines whether to invert the evaluation test data D8.

In the above embodiment, the data inversion determination process is executed according to the twisting positions based on twist information which indicates row addresses assigned to a prescribed number of word lines WL1, ..., WL512 wired on one and the other ends in a line direction of each memory cell array MSA1 to MSA4 and the first to fourth areas AREA1 to AREA4 having the prescribed number of word lines WL1, ..., WL512 in a relational manner. Then the data inversion determination process is executed according to the shift of the row addresses based on the twist information and shift information which indicates all shifted row addresses, the shift direction of the shifted row addresses and the shift amount of the shifted row addresses from the row addresses by relating them to each shifted row address. This invention is not limited to this and, when the shift-redundancy process is executed, twist and shift information are created based on twist information, all shifted row addresses, the shifted direction of the all shifted row addresses, and the shifted amount of the all shifted row addresses from the original row addresses, the twist and shift information indicating row addresses and shifted row addresses assigned to all word lines WL1, . . . , WL512 and redundant word lines RWLL1, . . . , RWLL8 and RWLH1, . . . , RWLH8 usable after the execution of the shift-redundancy process and wire position nonswitching parts NCAR10 to NCAR12 and wire position switching parts CCAR10 and CCAR11 of the bit line pairs BL1, . . . , BL128 that the word lines WL1, . . . , WL512 and redundant word lines RWLL1, . . . , RWLL8 and RWLH1, . . . , RWLH8 assigned the row addresses and shifted row addresses cross. If the shift-redundancy process is not executed, the data inversion determination is performed based on the twist information. If the shift-redundancy process is executed, on the contrary, the data inversion determination is performed based on the twist and shift information.

By using the twist and shift information, bit line pairs BL1, . . . , BL128 of which the wire position switching parts CCAR10 and CCAR11 cross the word line WL1, . . . , WL512 and redundant word line RWLL1, . . . , RWLL8 and RWLH1, . . . , RWLH8 specified by an input row address are easily identified only by comparing the row addresses and shifted row addresses based on the twist and shift information with the input row address. Therefore, it can be correctly determined whether to apply inversion to data, only by one-time data inversion determination process. As a result, the inversion determination circuit for twist 9 and the inversion determination circuit for shift 16 of the data inversion determination unit 8 can be constructed as one circuit, resulting in simpler circuit construction of the semiconductor storage device 1 and reducing processing loads in the data inversion determination process.

Further, in the above-described embodiment, row addresses are shifted eight by eight, which is a row address manageable number, in the shift-redundancy process. This invention, however, is not limited to this and row addresses can be shifted one by one. In this case, the number of executions of the shift-redundancy process can increase, resulting in avoiding the number of usable memory cells MS in the memory cell arrays MSA10 to MSA13 from decreasing due to broken memory cells NMS as much possible.

Still further, in the above-described embodiment, the data inversion determination process is executed at a time of storing and reproducing evaluation test data D8 and acceleration test data D15. This invention, however, is not limited to this and the data inversion determination process can be performed at the time of usual storage and reproduction. By doing so, the deterioration of functions can be confirmed by testing the semiconductor storage device 1 not only in manufacturing but also after shipping.

Still further, in the above-described embodiment, this invention is applied to the semiconductor storage device 1 where redundant memory cell regions RGAR1 to RGAR8 are provided on one and the other side in a line direction of each memory cell array MSA10 to MSA13 and the shift-redundancy process is executed by shifting row addresses in the line direction. This invention, however, is not limited to this and can be applied to other kinds of semiconductor storage devices such as DRAM and static random access memory (SRAM), for example, a semiconductor storage device where redundant memory cell regions are provided at prescribed positions in a row direction of a memory cell array and a shift-redundancy process is performed by shifting line addresses in the row direction, and a semiconductor storage device where redundant memory cell regions are provided at prescribed positions in a line direction of the memory cell arrays and at prescribed positions in a row direction and the shift-redundancy process can be executed either by shifting the row addresses in the line direction or by shifting the line addresses in the row direction.

In this connection, in a case of performing a shift-redundancy process in a line direction in a semiconductor device, row addresses are sequentially shifted in a row direction at least one by one, which is a line address manageable number. As a result, a plurality of redundant memory cells RMS of at least one line can be used for data storage and reproduction, instead of a plurality of memory cells MS of at least one line arranged between two bit lines BL1A and BL1B, . . . , BL128A and BL128B of one bit line pair BL1, . . . , BL128 which are a plurality of memory cells MS of a prescribed number of lines corresponding to the line address manageable number.

Still further, in the above-described embodiment, the memory cell array group 2 described with reference to FIG. 5 to FIG. 16 is applied as memory cells in which a plurality of memory cells are arranged in a array structure and a plurality of redundant memory cells are arranged in a array structure at prescribed positions in a row direction and/or line direction of the plurality of memory cells arranged in the array structure, a plurality of bit line pairs each comprising two bit lines arranges in almost parallel to the line direction and having wire position switching part(s) by twisting the two bit lines once or plural times and a plurality of word lines arranged in almost parallel to the row direction are provided, and memory cells or redundant memory cells are connected to the bit lines and word lines at a plurality of positions where a plurality of bit lines and a plurality of bit word lines crosses. This invention, however, is not limited to this and can be widely applied to memory cell arrays having other kinds of structures, such as one memory cell array in which redundant memory cells RMS of plural rows and/or plural lines are arranged at prescribed positions in the row direction and/or line direction.

Still further, in the above-described embodiment, the shift processing circuit 15 described with reference to FIG. 5 to FIG. 16 is applied as a shift-redundancy means which reassigns line addresses assigned to a plurality of bit line pairs connected to a plurality of memory cells to a plurality of other bit line pairs by sequentially shifting the line addresses in a row direction in a unit of a prescribed line address manageable number, in order to make redundant memory cells of prescribed lines usable for data storage and reproduction, instead of a plurality of memory cells of the prescribed lines corresponding to the line address manageable number, and/or sequentially reassigns row addresses assigned to a plurality of word lines connected to a plurality of memory cells to a plurality of other word lines by sequentially shifting the row addresses in a line direction in a unit of a prescribed row address manageable number, in order to make a plurality of redundant memory cells of prescribed rows usable for data storage and reproduction, instead of a plurality of memory cells of the prescribed rows corresponding to the row address manageable number. This invention, however, is not limited to this and can be widely applied to other kinds of shift-redundancy means, such as a shift processing circuit capable of performing a shift-redundancy process which sequentially shifts line addresses assigned to a plurality of bit line pairs BL1, . . . , BL128 in a unit of a prescribed line address manageable number in a line direction.

Still further, in the above-described embodiment, the data inversion determination unit 8 composed of the inversion determination circuit for twist 9 and the inversion determination circuit for shift 16 described with reference to FIG. 5 to FIG. 16 is applied as an identification means for identifying bit line pairs of which the wire position switching parts cross a word line specified by an input row address, based on the twisting positions of the bit line pairs and the shift of the row addresses. This invention, however, is not limited to this and other various kinds of identification means can be applied, such as a data inversion determination circuit incorporating an inversion determination circuit for twist and an inversion determination circuit for shift, and the shift processing circuit 15.

Still further, in the above-described embodiment, the data inversion determination unit 8 composed of the inversion determination circuit for twist 9 and the inversion determination circuit for shift 16 described with reference to FIG. 5 to FIG. 16 is applied as a determination means for determining whether to invert the level of evaluation test data which is supplied to bit line pairs of which the wire position switching parts cross a word line and is output from the bit line pairs, according to the identification result of the identification means. This invention, however, is not limited to this and can be widely applied to other various kinds of determination means, such a data inversion determination circuit incorporating the inversion determination circuit for twist and the inversion determination circuit for shift.

Still further, in the above-described embodiment, the inversion processor 4 described with reference to FIG. 5 to FIG. 16 is applied as an inversion means for inverting the level of evaluation test data which is supplied to the bit line pairs of which the wire position switching parts cross a word line, at the time of storing the evaluation test data, and for inverting the level of the evaluation test data output from the bit line pairs of which the wire position switching parts cross the word line, at the time of reproducing the evaluation test data. This invention, however, is not limited to this and can widely applied to an inversion means which has another structure and is installed at another position.

According to this invention described above, a shift-redundancy means reassigns line addresses assigned to a plurality of bit line pairs connected to a plurality of memory cells to a plurality of other bit line pairs by sequentially shifting the line addresses in a unit of a prescribed line address manageable number in a row direction, in order to make the redundant memory cells of prescribed lines usable for data storage and reproduction instead of a plurality of memory cells of the prescribed lines equal to the line address manageable number, and/or reassigns row addresses assigned a plurality of word lines connected to a plurality of memory cells to a plurality of other word lines by sequentially shifting the row addresses in a unit of a prescribed row address manageable number in a line direction, in order to make a plurality of redundant memory cells of prescribed rows usable for data storage and reproduction, instead of a plurality of memory cells of the prescribed rows equal to the row address manageable number. In this situation, at the time of storing and reproducing evaluation test data, an identification means identifies bit line pairs of which the wire position switching parts cross a word line specified by an input row address, based on the twisting positions of the bit line pairs and the shift of the row addresses. The determination means determines whether to invert the level of the evaluation test data which is supplied to the bit line pairs of which the wire position switching parts cross the word line and is output from the bit line pairs. The inversion means inverts the level of the evaluation test data which is supplied to the bit line pairs of which the wire position switching parts cross the word line, based on the determination result of the determination means at the time of storing the evaluation test data, and inverts the level of the evaluation test data output from the bit line pairs of which the wire position switching parts cross the word line, based on the determination result of the determination means at the time of reproducing the evaluation test data. Therefore, the evaluation test data of level "0", "1" can be stored in memory cells and redundant memory cells of the memory cell arrays, in a storing pattern previously selected according to the physical arrangement of the memory cells, and the stored data can be inverted and output by offsetting the inversion executed at the time of storage. As a result, a semiconductor storage device capable of being correctly evaluated can be realized.

While there has been described in connection with the preferred embodiments of the invention, it will be obvious to those skilled in the art that various changes and modifications may be aimed, therefore, to cover in the appended claims all such changes and modifications as fall within the true spirit and scope of the invention.

What is claimed is:

1. A semiconductor storage device comprising:
a memory cell array in which a plurality of memory cells are arranged in an array structure, a plurality of redundant memory cells are arranged in an array structure at prescribed positions in a row direction and/or line direction of the plurality of memory cells in the array structure, a plurality of bit line pairs each composed of two bit lines arranged in almost parallel to the line direction and having wire position switching parts of the two bit lines by twisting the two bit lines at one or plural positions in the line direction is arranged, a plurality of word lines is arranged in almost parallel to the row direction, and the memory cells or the redundant memory cells are connected to the bit lines and the word lines at a plurality of crossing positions of the plurality of bit lines and the plurality of word lines;
shift-redundancy means for reassigning line addresses assigned to the plurality of bit line pairs connected to the plurality of memory cells to a plurality of other bit line pairs by sequentially shifting the line addresses in the row direction in a unit of a prescribed line address manageable number, in order to make the redundant memory cells of prescribed lines usable for data storage and reproduction instead of the plurality of memory cells of the prescribed lines equal to the line address manageable number, and/or for reassigning row addresses assigned to the plurality of word lines connected to the plurality of memory cells to a plurality of other word lines by sequentially shifting the row addresses in the line direction in a unit of a prescribed row address manageable number, in order to make the plurality of redundant memory cells of a plurality of rows usable for the data storage and reproduction instead of the plurality of memory cells of the prescribed rows equal to the row address manageable number;
identification means for identifying the bit line pairs of which the wire position switching parts cross a word line specified by an input row address, based on twisting positions of the bit line pairs and shift of the row addresses;
determination means for determining based on an identification result of the identification means whether to invert a level of the evaluation test data to be given to the bit line pairs of which the wire position switching parts cross the word line and output from the bit line pairs; and inversion means for, depending on a determination result of the determination means, inverting the level of the evaluation test data to be supplied to the bit line pairs of which the wire position switching parts cross the word line at a time of storing the evaluation test data, and inverting the level of the evaluation test data output from the bit line pairs of which the wire position switching parts cross the word line at the time of reproducing the evaluation test data.

2. The semiconductor storage device according to claim 1, wherein:

the identification means identifies the bit line pairs of which the wire position switching parts cross the word line specified by the input row address, based on the twisting positions of the bit line pairs and the shift of the row addresses, at a time of storing and reproducing data other than the evaluation test data; and the inversion means inverts, according to the determination result of the determination means, the level of the other data to be given to the bit line pairs of which the wire position switching parts cross the word line at a time of storing the other data, and the level of the other data output from the bit line pairs of which the wire position switching parts cross the word line at the time of reproducing the other data.

3. A storing and reproduction method of a semiconductor storage device, comprising:

in a memory cell array in which a plurality of memory cells are arranged in an array structure, a plurality of redundant memory cells are arranged in an array structure at prescribed positions in a row direction and/or line direction of the plurality of memory cells in the array structure, a plurality of bit line pairs each composed of two bit lines arranged in almost parallel to the line direction and having wire position switching parts of the two bit lines by twisting the two bit lines at one or plural positions in the line direction is arranged, a plurality of word lines is arranged in almost parallel to the row direction, and the memory cells or the redundant memory cells are connected to the bit lines and the word lines at a plurality of crossing positions of the plurality of bit lines and the plurality of word lines, a shift-redundancy step of reassigning line addresses assigned to the plurality of bit line pairs connected to the plurality of memory cells to a plurality of other bit line pairs by sequentially shifting the line addresses in the row direction in a unit of a prescribed line address manageable number, in order to make the redundant memory cells of prescribed lines usable for data storage and reproduction instead of the plurality of memory cells of the prescribed lines equal to the line address manageable number, and/or of reassigning row addresses assigned to the plurality of word lines connected to the plurality of memory cells to a plurality of other word lines by sequentially shifting the row addresses in the line direction in a unit of a prescribed row address manageable number, in order to make the plurality of redundant memory cells of a plurality of rows usable for the data storage and reproduction instead of the plurality of memory cells of the prescribed rows equal to the row address manageable number;

an identification step for storage of, at a time of storing evaluation test data, identifying the bit line pairs of which the wire position switching parts cross a word line specified by an input row address, based on twisting positions of the bit line pairs and shift of the row addresses;

a determination step for storage of determining whether to invert a level of the evaluation test data to be given to the bit line pairs of which the wire position switching parts cross the word line, based on an identification result of the identification step for storage;

an input inversion storing step of inverting the level of the evaluation test data depending on the determination result of the determination step for storage, and storing the evaluation test data of which the level has been inverted, in the memory cells or the redundant memory cells connected to the bit line pairs by giving the evaluation test data to the bit line pairs of which the wire position switching parts cross the word line;

an identification step for reproduction of, at a time of reproducing the evaluation test data, identifying the bit line pairs of which the wire position switching parts cross the word line specified by the input row address, based on the twisting positions of the bit line pairs and the shift of the row addresses;

a determination step for reproduction of determining whether to invert the level of the evaluation test data output from the bit line pairs of which the wire position switching parts cross the word line, based on an identification result of the identification step for reproduction; and an output inversion reproduction step of inverting the level of the evaluation test data reproduced from the memory cells or the redundant memory cells through the bit line pairs of which the wire position switching parts cross the word line, depending on a determination result of the determination step for reproduction and outputting the evaluation test data.

* * * * *